(12) United States Patent
Date et al.

(10) Patent No.: US 7,299,392 B2
(45) Date of Patent: Nov. 20, 2007

(54) SEMICONDUCTOR INTEGRATED CIRCUIT DEVICE AND METHOD OF DESIGN OF SEMICONDUCTOR INTEGRATED CIRCUIT DEVICE

(75) Inventors: Hisakazu Date, Ome (JP); Toyohito Ikeya, Higashimurayama (JP); Masatoshi Kawashima, Hamura (JP)

(73) Assignee: Hitachi, Ltd., Tokyo (JP)

( * ) Notice: Subject to any disclaimer, the term of this patent is extended or adjusted under 35 U.S.C. 154(b) by 360 days.

(21) Appl. No.: 10/291,599

(22) Filed: Nov. 12, 2002

(65) Prior Publication Data

US 2003/0094934 A1 May 22, 2003

(30) Foreign Application Priority Data

Nov. 20, 2001 (JP) ............................. 2001-354023
Sep. 30, 2002 (JP) ............................. 2002-285006

(51) Int. Cl.
*G01R 31/28* (2006.01)

(52) U.S. Cl. ...................... 714/731; 714/726; 714/729; 714/739; 714/744

(58) Field of Classification Search ................ 714/724, 714/726, 727, 728, 729, 732, 733, 734, 738, 714/739, 744
See application file for complete search history.

(56) References Cited

U.S. PATENT DOCUMENTS 5,524,114 A * 6/1996 Peng ........................... 714/724
6,055,658 A * 4/2000 Jaber et al. .................. 714/726
6,158,032 A * 12/2000 Currier et al. ............... 714/726
6,418,545 B1 * 7/2002 Adusumilli .................. 714/729
6,442,722 B1 * 8/2002 Nadeau-Dostie et al. ... 714/731

(Continued)

FOREIGN PATENT DOCUMENTS

JP 61-042933 8/1984

(Continued)

OTHER PUBLICATIONS

Japanese Notification of Reasons for Refusal with English translation, no date.

(Continued)

*Primary Examiner*—Guy Lamarre
*Assistant Examiner*—John P Trimmings
(74) *Attorney, Agent, or Firm*—Reed Smith LLP; Stanley P. Fisher, Esq.; Juan Carlos A. Marquez, Esq.

(57) ABSTRACT

A semiconductor integrated circuit device having a test clock generating circuit enabling a high performance test operation and a method of designing a semiconductor integrated circuit device enabling setting of high precision timing margins is disclosed. A test clock generating circuit having a register sequential circuit and a clock output control circuit is provided between a pulse generating circuit and a logic circuit. When a test operation is active, transfer of a clock pulse generated in the pulse generating circuit to the logic circuit is stopped and a test clock pulse operating the logic circuit is outputted using a pulse signal generated in the pulse generating circuit by controlling a clock transfer control circuit with the sequential circuit depending on setting information of a register. The test clock generating circuit is comprised using a logic design tool utilizing a computer in order to test logic circuit functions and timing margins.

11 Claims, 19 Drawing Sheets

U.S. PATENT DOCUMENTS

| | | |
|---|---|---|
| 6,598,192 B1 * | 7/2003 | McLaurin et al. .......... 714/726 |
| 6,671,848 B1 * | 12/2003 | Mulig et al. ................. 714/744 |
| 6,738,921 B2 * | 5/2004 | Lo et al. ...................... 713/500 |
| 6,966,021 B2 * | 11/2005 | Rajski et al. ................ 714/726 |

FOREIGN PATENT DOCUMENTS

| JP | 10-307167 | 5/1997 |
|---|---|---|
| JP | 11-142478 | 11/1997 |

OTHER PUBLICATIONS

Japanese Decision of Refusal with English translation, no date.

* cited by examiner

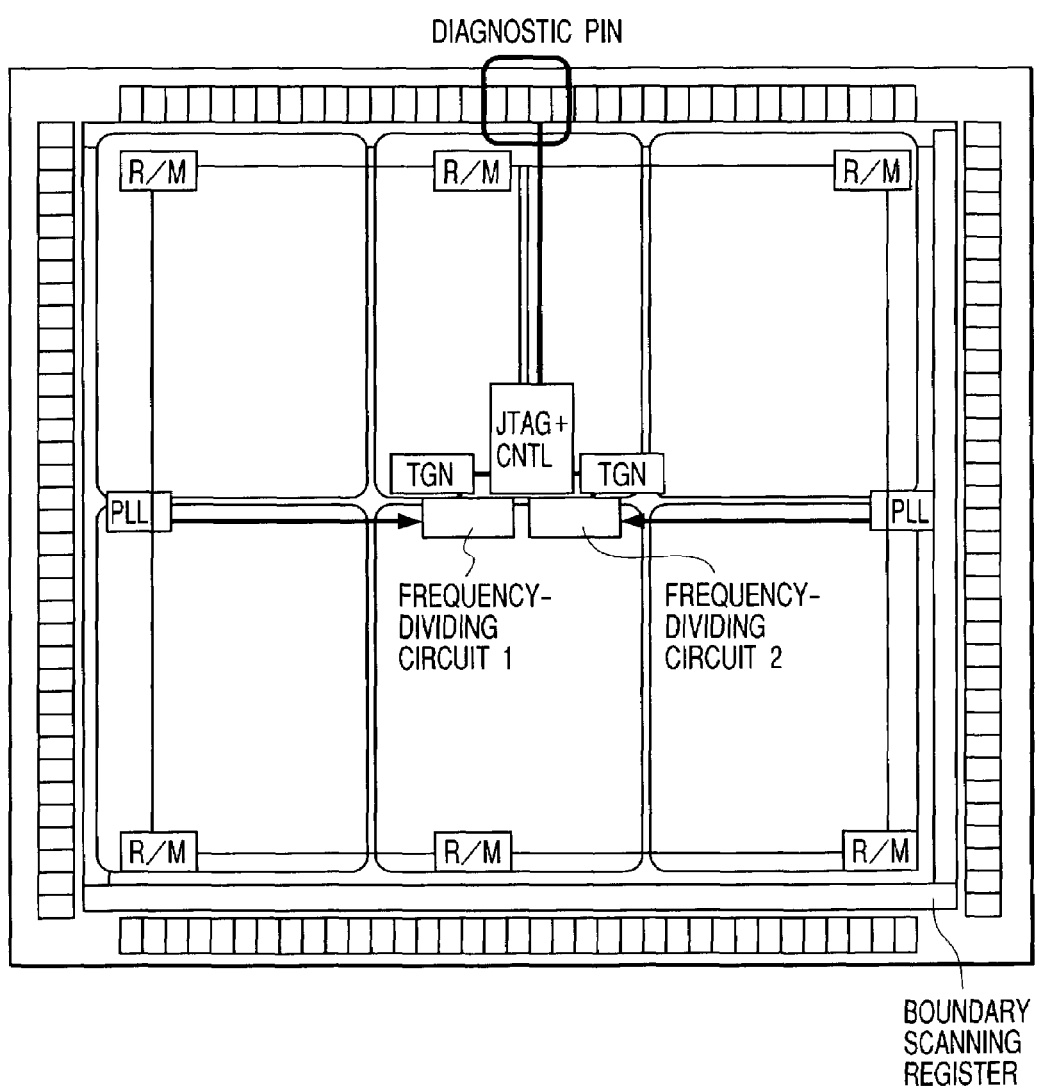

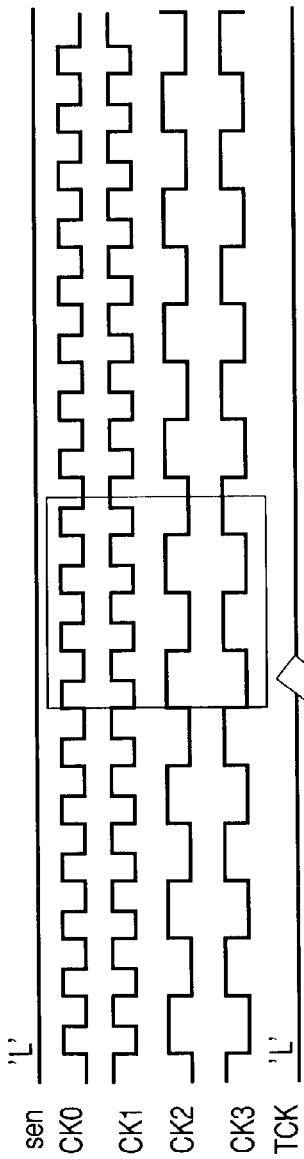
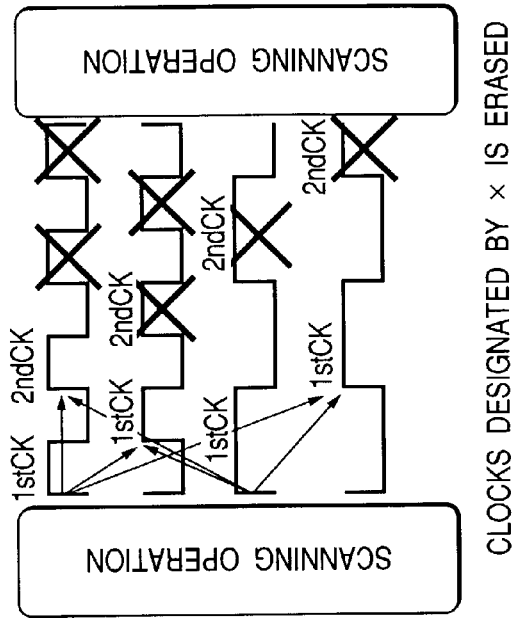
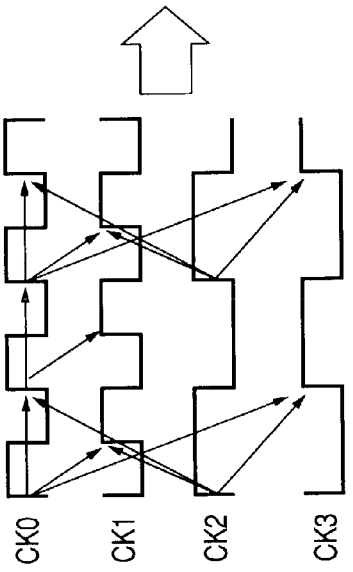
FIG. 12(A)
FIG. 12(B)
FIG. 12(C)
CLOCKS DESIGNATED BY × IS ERASED

SEMICONDUCTOR INTEGRATED CIRCUIT DEVICE AND METHOD OF DESIGN OF SEMICONDUCTOR INTEGRATED CIRCUIT DEVICE

BACKGROUND OF THE INVENTION

The present invention relates to a semiconductor integrated circuit device and a method of designing the same semiconductor integrated circuit device and particularly to a technique which can be effectively applied to the operation test technique of an internal logic circuit.

Supply of clock from an external circuit cannot be controlled for a digital integrated circuit device comprising a built-in pulse generating circuit such as a PLL circuit. Therefore, in the AC (Alternate Current) operation test of an internal logic circuit, it is considered to provide a combination circuit as illustrated in FIG. 17 in order to control the clock pulse to be supplied to the internal logic circuit. Namely, here is introduced the sequence that a test pattern is set to a flip-flop FF of the logic circuit using a scanning circuit, a combination circuit is controlled to output the first clock pulse to transfer an input signal to the logic stage and generate the second clock pulse, and an output signal of the logic stage is fetched by the flip-flop FF and a test result is collected using the scanning circuit. The Japanese Unexamined Patent Application Publication 1999(11)-142478 discloses an example of a semiconductor integrated circuit which comprises a clock multiplying circuit within a chip thereof in order to execute the test during the actual operation.

SUMMARY OF THE INVENTION

In above combination circuit, the test is possible only in the fixed combination among the multi-phase clocks formed by the PLL circuit. Moreover, the circuit design is required for each combination corresponding to logic circuit, operation frequency and clock used and thereby the number of procedures required for circuit design is increased. Accordingly, an external clock must be applied for the test in the desired timing but a logic circuit to realize high speed operation is introduced and development of a high performance test apparatus which can verify the timing margin of such high speed logic circuit is necessary using an extraordinary development cost. Therefore, such development of high performance test apparatus is not practical.

It is therefore an object of the present invention to provide a semiconductor integrated circuit device provided with a test clock generating circuit enabling high performance test operation. It is another object of the present invention to provide a method of designing a semiconductor integrated circuit device enabling the setting of a high precision timing margin or the like. The aforementioned and other objects and novel features of the present invention will become apparent from description of the present specification and the accompanying drawings.

A profile of the present invention will be explained briefly as follows. Namely, a test clock generating circuit provided with a register sequential circuit and a clock transfer control circuit is provided between a pulse generating circuit and a logic circuit. When a test operation is validated, transfer of clock pulse formed by the pulse generating circuit to the logic circuit is stopped, the clock transfer control circuit is controlled with the sequential circuit depending on the setting information of the register and the clock pulse for operating the logic circuit is outputted using the clock pulse generated in the pulse generating circuit.

Another profile of the present invention will be explained briefly as follows. Namely, a logic circuit for realizing the desired logic functions and a pulse generating circuit to form the clock pulse required for operation of such logic circuit are designed on a logic design tool utilizing a computer and a test clock generating circuit, which is provided with a register sequential circuit and a clock output control circuit to stop, when the test operation is validated, the transfer of the clock pulse formed by the pulse generating circuit to the logic circuit and outputs a clock pulse for operating the logic circuit using the clock pulse formed by the pulse generating circuit by controlling the clock transfer control circuit with the sequential circuit depending on the setting information of the register is built to above circuit. Accordingly, this test clock generating circuit is capable of conducting the test of logic circuit function and timing margin.

BRIEF DESCRIPTION OF THE DRAWINGS

FIG. 11 is a total structure diagram illustrating an embodiment of the semiconductor integrated circuit device of the present invention.

FIGS. 12(A), 12(B), 12(C) are waveform diagrams for explaining the other embodiment of the test operations using the test clock generating circuit of the present invention.

DETAILED DESCRIPTION OF THE PREFERRED EMBODIMENTS

Figure 1:
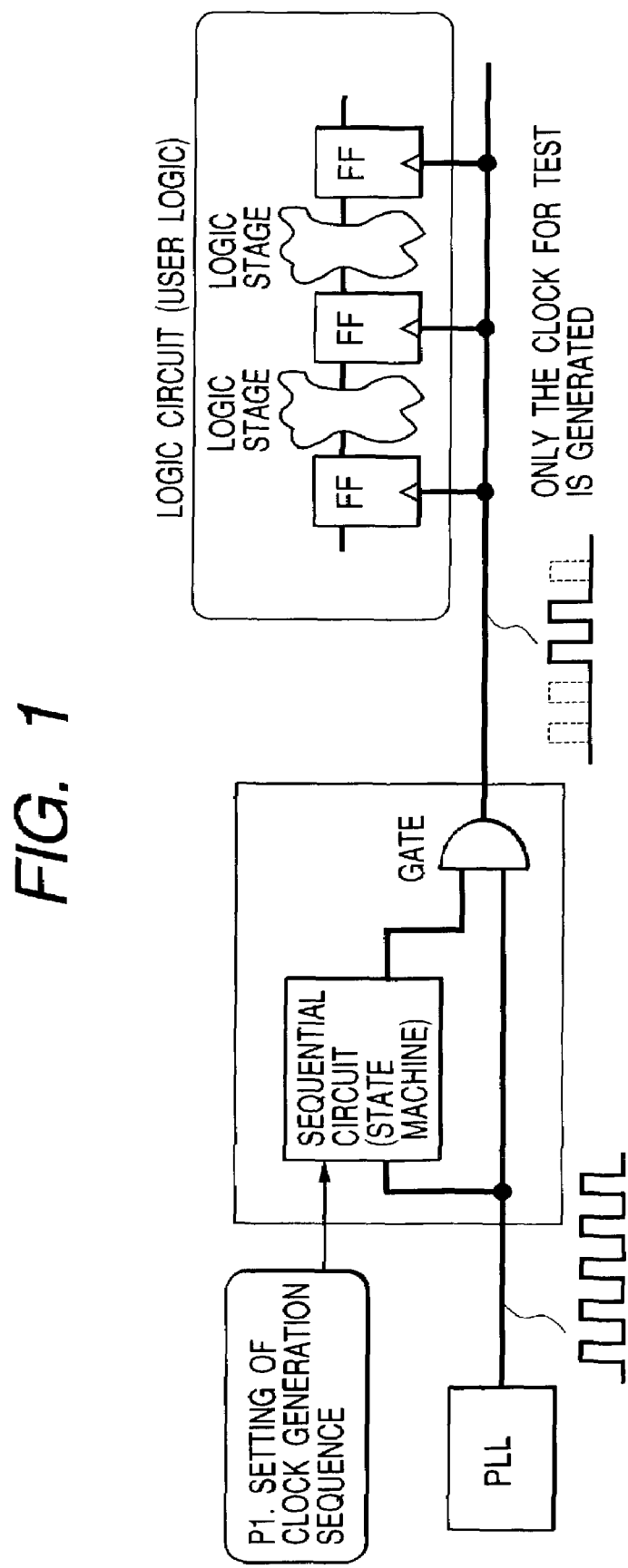
FIG. 1 is a block diagram of the essential portion illustrating an embodiment of a semiconductor integrated circuit device of the present invention.

FIG. 1 is a block diagram of the essential portion of an embodiment of a semiconductor integrated circuit device of the present invention. In this embodiment, PLL (Phase Lock Loop) circuit generates an internal clock of higher frequency for an externally supplied clock pulse and then supplies this internal clock to a logic circuit (user logic).

A basic structure of this logic circuit is formed in combination in unit of flip-flop FF—logic stage—flip-flop FF and a clock pulse is supplied to above flip-flops FFs. A signal held in the flip-flop FF provided in an input side of the logic stage is inputted to such logic stage synchronously with the clock pulse. In the logic stage, logic process is executed corresponding to an input signal and a result is transferred to an input terminal of a flip-flop FF provided in the output side thereof. The flip-flop FF in the output side fetches and hold an output signal of the logic stage synchronously with the next clock pulse. As explained above, a logic sequence is executed synchronously with the clock pulse.

In view of performing an AC test of a logic circuit as explained above, a test input signal is supplied to a flip-flop FF provided in the input side of the logic stage under the condition that supply of the clock pulse is stopped and after setting of the test input signal is completed, it is required to supply, to the logic stage, the test input signal fetched to the flip-flop FF by supplying the first clock pulse and then to supply the second clock pulse in order to fetch the corresponding output signal to the flip-flop FF. However, in a clock pulse generating circuit using a PLL circuit as explained above, it is difficult to supply/stop two clock pulses in the necessary timing with an external control signal because these clock pulses have higher frequency than that of the pulse externally supplied.

In this embodiment, a test clock generating circuit is provided between a PLL circuit and a logic circuit explained above. This test clock generating circuit is controlled to generate a test clock in the desired timing depending on the sequence of test clock generation. Namely, a sequential circuit (state machine) generates a test clock required for test of a logic circuit depending on the clock generation sequence. The generation sequence of the clock required to realize AC test operation can be controlled while a clock pulse is generated with a built-in clock generating circuit such as PLL circuit by giving thereto a function to control the supply of clock to the logic circuit depending on the input condition of the sequential circuit.

The test clock generating circuit is provided with a gate means as a clock pulse transfer control circuit like an AND gate circuit. Therefore, a clock pulse formed in the PLL circuit is transferred to the logic circuit during the ordinary operation to execute the required logic operations. During the AC test operation for verifying such logic operations, the gate means is closed to stop the supply of clock pulse generated by the PLL circuit to the logic circuit. Accordingly, the clock pulse is not supplied to a user logic as indicated with a dotted line.

Under this clock suspending condition, a test circuit inputs a test pattern to a flip-flop FF of the logic circuit. For such input of the test pattern, the flip-flop FF of the user logic is connected to form a shift register to serially input the test pattern. When input of the test pattern is completed, the gate means is controlled to supply the first and second clock pulses.

With the first clock pulse, the test pattern fetched by the flip-flop FF is outputted and is then transferred to the logic stage provided in the rear stage side. In the logic stage, the logic process is executed corresponding to the input pattern and is then transferred to the input of the flip-flop FF provided in the rear stage side. The flip-flop FF fetches a logic output from the logic stage with supply of the second clock pulse. Therefore, the signal transfer is executed using a logic path of the flip-flop FF—logic gate—flip-flop FF with a couple of clock pulses of the first and second clock pulses. After the second clock pulse is supplied, the gate means is closed and thereby supply of the clock is stopped again. Therefore, the flip-flop FF holds a logic output obtained through the logic stage allocated in the preceding stage and a test result can be collected using again the scanning circuit.

Figure 2:
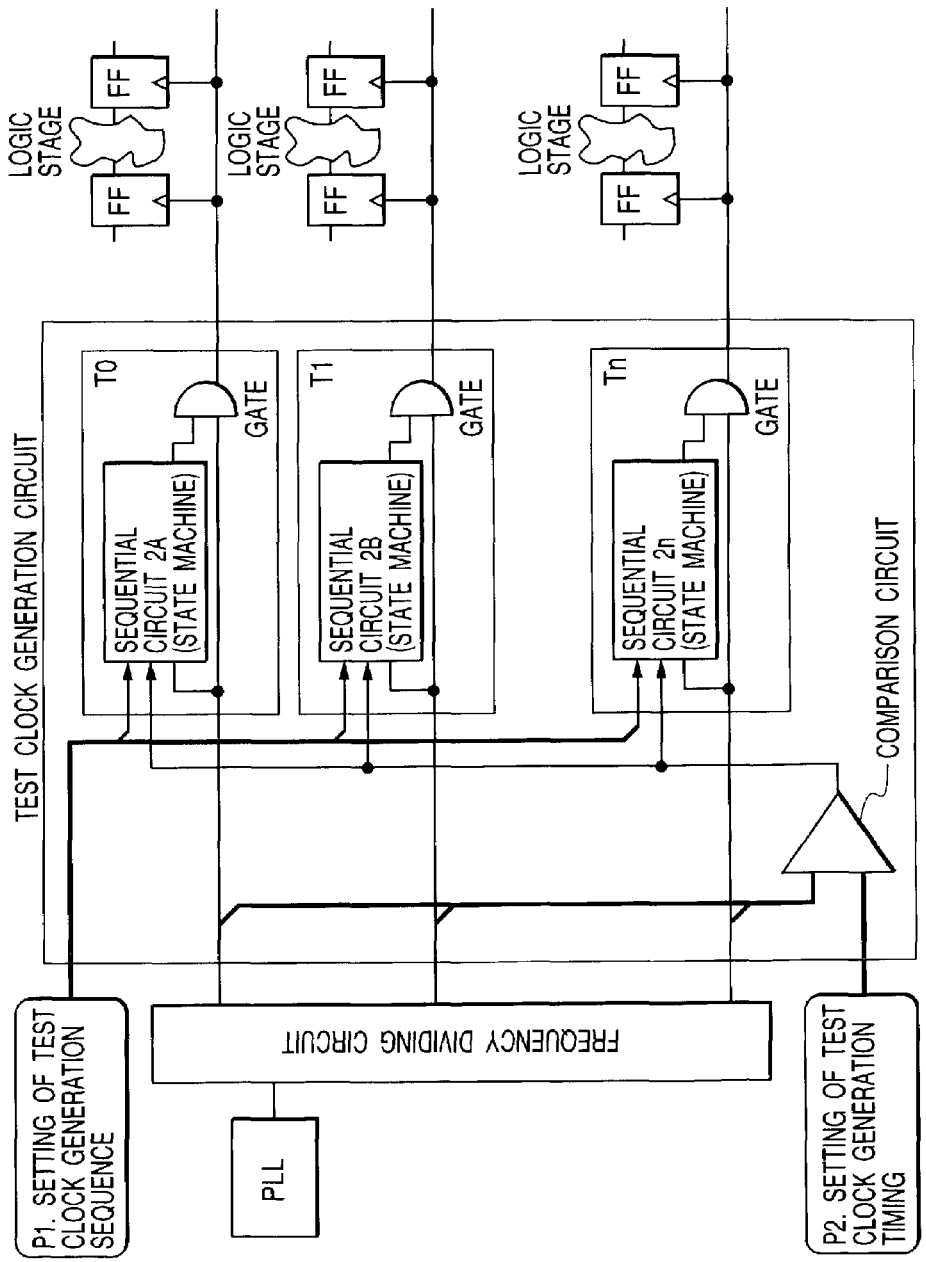
FIG. 2 is a block diagram of the essential portion illustrating another embodiment of the semiconductor integrated circuit device of the present invention.

FIG. 2 is a block diagram of the essential portion of the other embodiment of the semiconductor integrated circuit device of the present invention. This embodiment is intended to a logic circuit in which a multi-phase clock outputted from a frequency-dividing circuit in the synchronous design is used. For the clock of each phase, a clock generating circuit T0 to Tn provided with a sequential circuit(state machine) 2A to 2n explained above is provided and moreover a comparing circuit is also provided to detect the desired condition of each clock phase. A matching signal of this comparing circuit is used as a start signal of the clock generating circuit T0 to Tn and thereby generation of not only the same clock phase but also different clock phases can be controlled.

In this embodiment, logic circuits which are operated with a plurality of kinds of clock pulses having different phases and frequencies generated with the frequency-dividing circuit are provided. Corresponding to the clock pulses, a plurality of clock generating circuits T0 to Tn provided with the sequential circuits 2A to 2n and clock pulse transfer control circuit as explained in the embodiment of FIG. 1 are also provided. For these clock generating circuits T0 to Tn, a circuit P1 for setting in common the test clock generating means, a circuit P2 for setting the test clock generation timing and a comparing circuit to detect such timing are provided.

Figure 3:
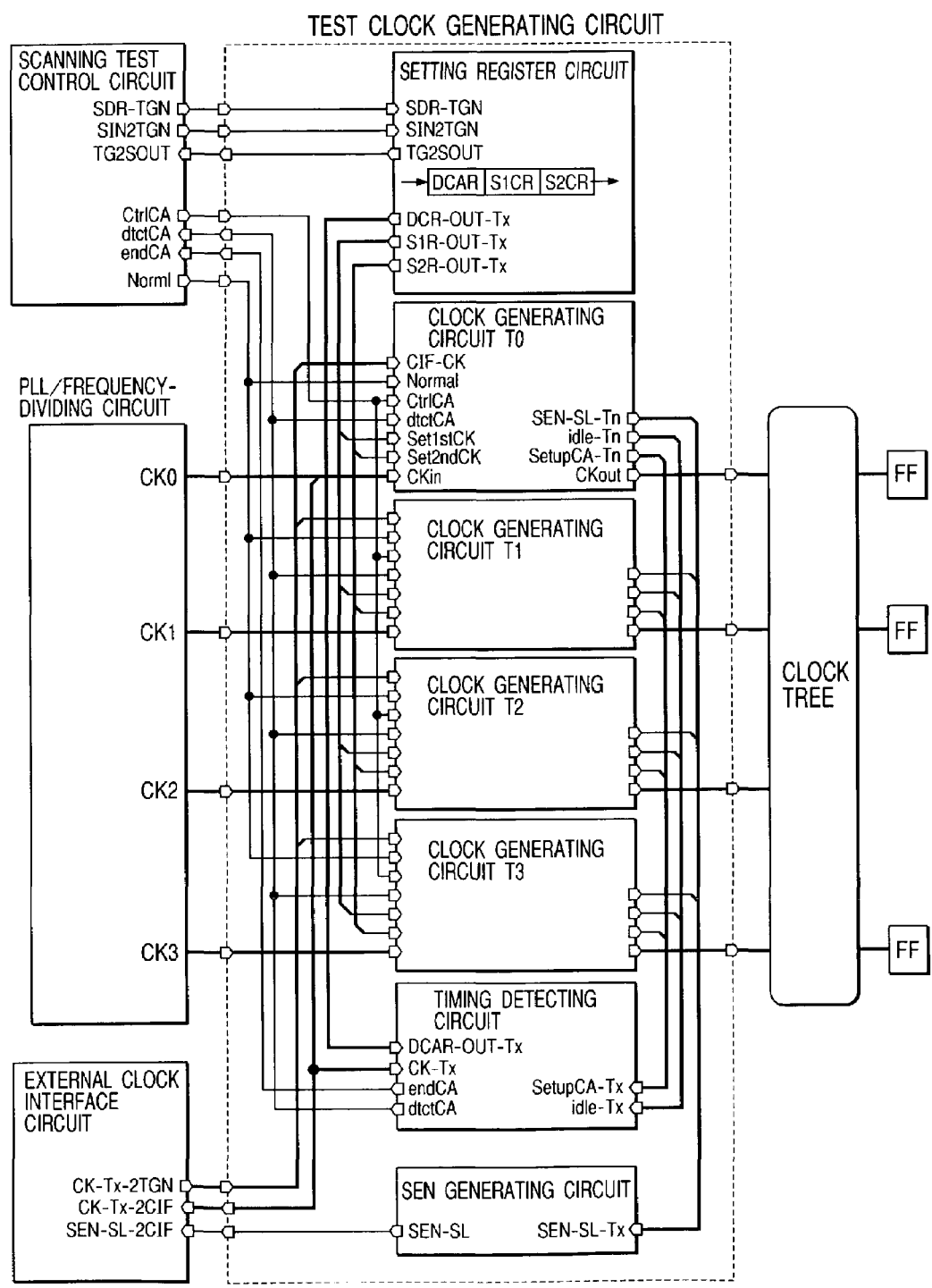
FIG. 3 is a block diagram illustrating an embodiment of a test clock generating circuit and circuits related thereto of the semiconductor integrated circuit device of the present invention.

FIG. 3 is a block diagram of an embodiment of the test clock generating circuit of the semiconductor integrated circuit device of the present invention and the circuits related thereto. This figure corresponds to the embodiment of FIG. 2 and illustrates each circuit block more practically. This embodiment is applied, although not particularly restricted, when the clock pulses of four phases CK0 to CK3 are used. In this case, CK2 is obtained by dividing the frequency of CK0 to a half, while CK1 is an inverted pulse of CK0 and CK3 is an inverted pulse of CK2.

The test clock generating circuit is provided with a setting register circuit, clock generating circuits T0 to T3, a timing detecting circuit and an SEN (scanning) generating circuit. A scanning test control circuit forms a setting information supplied to the setting register circuit and various control signals supplied to the clock generating circuits and timing detecting circuit. An external clock interface circuit enables external supply of clock in place of the clock generated by a clock generating circuit consisting of a PLL/frequency-dividing circuit.

An output part of the clock generating circuits T0 to T3 is provided with a clock tree. This clock tree is composed of a signal transfer system with which the clock pulse outputted from each clock generating circuit T0 to T3 is supplied in the equal delay time to each flip-flop FF of the logic stage and is formed, for example, of the clock wirings having the same length and of the clock buffer of the same number of stages. Accordingly, in the flip-flop FF forming the logic circuit to receive the clock pulse of each phase, the clock pulse is supplied in the equal propagation delay time to reduce the clock pulse queue. Thereby, the logic circuit may be operated with the clock pulse of higher frequency.

The clock generating circuit T0 to T3 is an AC test simplifying circuit to realize the AC test in unit of clock phase. This circuit enables the control of supply and stop of clock pulse in the desired timing during the test operation as explained above. The setting register circuit is formed as an aggregation of the flop-flop circuits for holding the clock generation conditions explained above. The timing detecting circuit detects each clock phase and also monitors the condition of each clock generating circuit. The SEN generating circuit forms a control signal for switching the scanning of test data and fetching of user data.

The setting register has DCAR, S1CR, S2CR. DCAR is used to set an output value of each clock for detection of timing. One bit is assigned for one phase. S1CR is used to set whether the first clock is outputted or not after detection of timing. One bit is also assigned for one phase. S2CR is used to set whether the second clock is outputted or not after detection of timing. One bit is assigned for one phase. The clock generating circuit is provided for every clock phase.

The timing detection circuit inputs the clock of each phase, an output value of the setting register (DCAR) and also a condition of each clock generating circuit. This circuit outputs a signal indicating a result (match/mismatch) of the comparing circuit to the output circuit thereof and also outputs a SEN signal for switching the scanning and normal conditions.

Figure 4:
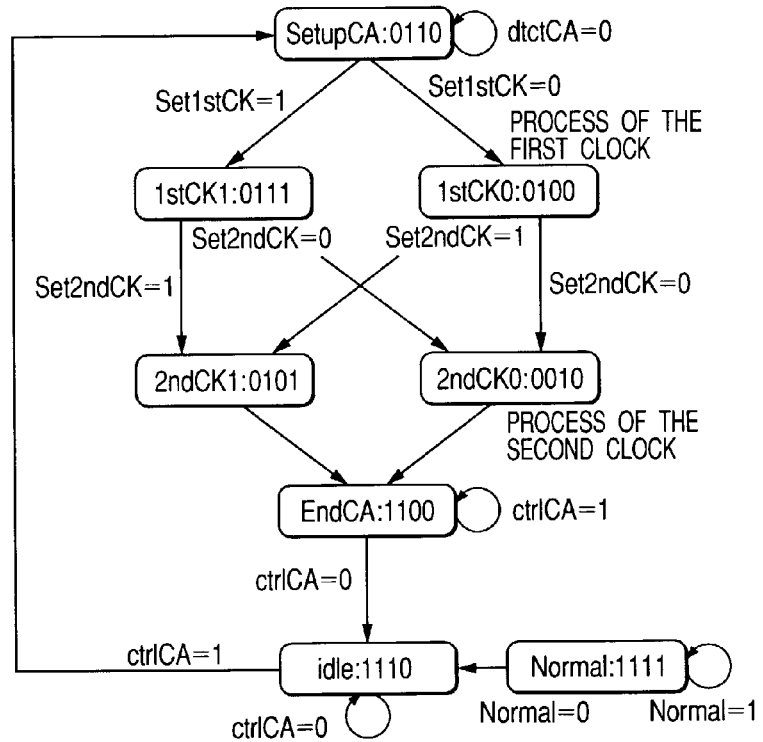
FIG. 4 is a status transition diagram illustrating an embodiment of a clock generating circuit used in the present invention.
Figure 5:
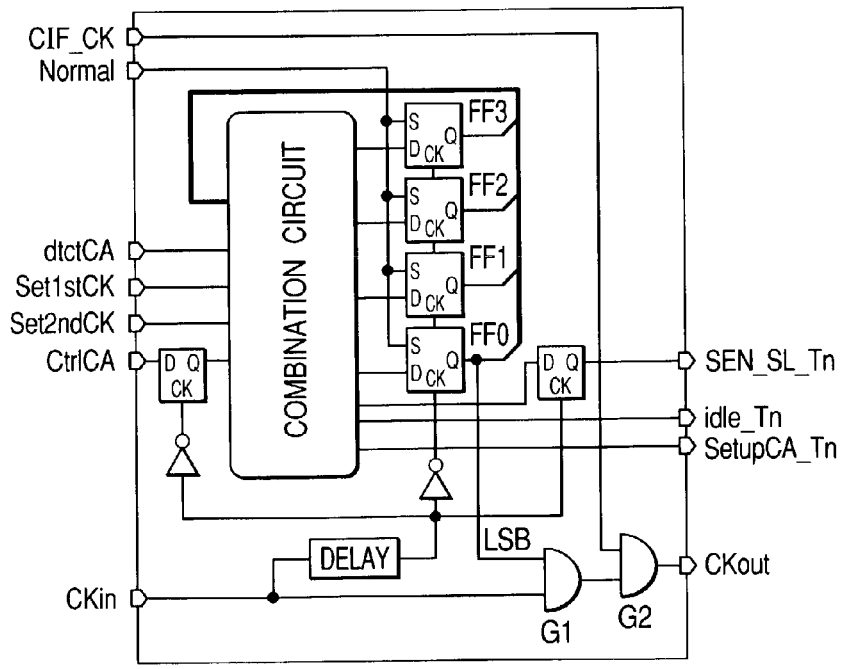
FIG. 5 is a circuit structure diagram illustrating an embodiment of the clock generating circuit corresponding to FIG. 4.

FIG. 4 is a status transition diagram of an embodiment of the clock generating circuit used in the present invention. FIG. 5 is a circuit structure diagram of an embodiment of the clock generating circuit. This embodiment is a state machine consisting of flip-flop circuits FF0 to FF3 of four bits. This circuit can generate continuous two clocks and outputs respective clocks to the control terminal or controls this output.

In FIG. 5, generation of the first clock is controlled with a signal Set1stCK, while generation of the second clock is controlled with a signal Set2ndCK. A signal Normal is controlled to set asynchronously the normal state. These are indicated as a state of status transition. One bit of the least significant bit LSB among the flip-flop circuits FF0 to FF3 of four bits is used for clock control and is also supplied to the gate circuit G1. Thereby, when the LSB is logic 1, the gate is opened to result in the enable state to transfer the clock and when the LSB is logic 0, the gate is closed to result in the disable state to stop the transfer of the clock.

When the clock is applied from a route other than a frequency-dividing circuit as the built-in clock generating circuit, the clock is applied from the CIF-CK. Namely, an output of the gate circuit G1 and the external clock are outputted from the clock output Ckout through an OR (logical sum) gate G2. As the clock to the flip-flop circuits FF0 to FF3 of four bits, an inverted clock transferred through a delay circuit (delay) is used not to change a duty ratio when the clock is generated.

In order to express combination of the status transition, the flip-flop circuits FF0 to FF3 of four bits are used. One LSB bit is used as the clock enable bit. The flip-flop circuit between the control signal ctr1CA and combination circuit is assigned to avoid metastable. The flip-flop circuit between the output terminal SEN-SL-Tn and the combination circuit is assigned for adjusting the SEN switch timing.

Progress sequence of status transition in FIG. 4 will be explained. As the initial state, the normal state is set (FF3 to FF0: 1111). During the test state, the idle state is set (FF3 to FF0: 1110). When a clock generation request is issued, the setup (SetupCA) state is set (FF3 to FF0: 0110) and is then shifted to the first (1st) clock process, 1stCK0 (FF3 to FF0: 0100) or 1stCK1(FF3 to FF0: 0111) according to the clock generation sequence. Moreover, for generation of the second clock, the state is shifted to the 2ndCK0 or 2ndCK1. Upon completion of the process up to this state, the state is returned to the idle state to wait for the next clock generation request.

In above status transition diagram, when the register setting information is as follows, Set1stCK=1, Set2ndCK=1, the LSB becomes logic 1 to enable the gate to output the first clock pulse and second clock pulse. Meanwhile, when Set1stCK=0, Set2ndCK=0, the LSB becomes logic 0 to disable the gate to stop the output of clock. Thereby, it is also possible that only any one of the first clock pulse and second clock pulse is supplied to the logic circuit. Such clock pulse output function is required to verify the signal transfer among the logic circuits to be operated with different clock pulses as will be explained later.

As explained above, "Normal" indicates the normal state, while "idle" indicates that the clock generating circuit is not used even in the test condition. This state is held until a clock generation request (ctr1CA=1) is generated. SetupCA indicates the clock generation ready state and is held until a timing detection signal (dtctCA=1) is issued.

In the first clock process, the first clock is outputted depending on a value of the 1stCK0/1stCK (setting register S1CR). 1stCK0 is set when the setting register value is 0 and the clock is never generated. 1stCK1 is set when the setting register value is 1 and the clock is generated. In the second clock process, the second clock is outputted depending on a value of the 2ndCK/1stCK (setting register S2CR). 2ndCK0 is set when the setting register value is 0 and the clock is never generated. 2ndCK1 is set when the setting register value is 1 and the clock is generated. EndCA indicated the end of the test clock generating circuit. When the clock generation request is cancelled (ctr1CA=0), the state returns to idle.

Figure 6:
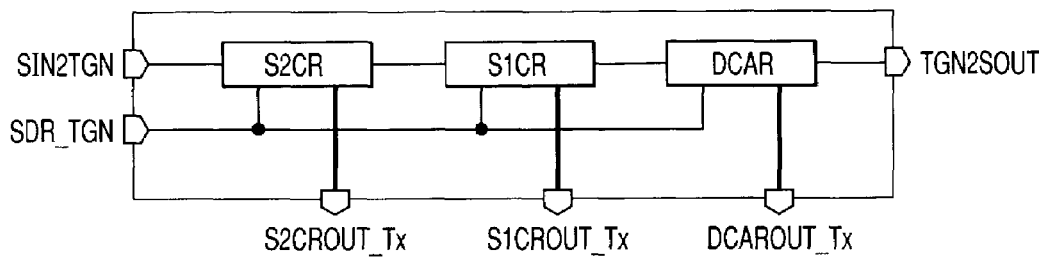
FIG. 6 is a block diagram illustrating an embodiment of a setting register of FIG. 3.

FIG. 6 is a block diagram of an embodiment of the setting register. The setting register is composed of S2CR, S1CR and DCAR. SIN2TGN is a serial input terminal to input a setting value of register. TGN2SOUT is a serial output terminal.

The first clock generating conditions of four phases (CK0 to CK3) are held in the terminal S1CROUT-Tx corresponding to register S1CR. The second clock generating conditions of four phases (CK0 to CK3) are held in the terminal S2CROUT-Tx corresponding to the register S2CR. The data of clock generation timing of four phases (CK0 to CK3) are held in the terminal DCAROUT-Tx corresponding to the register DCAR. The terminal SDR-TGN is the signal input terminal for instructing the scanning.

Figure 7:
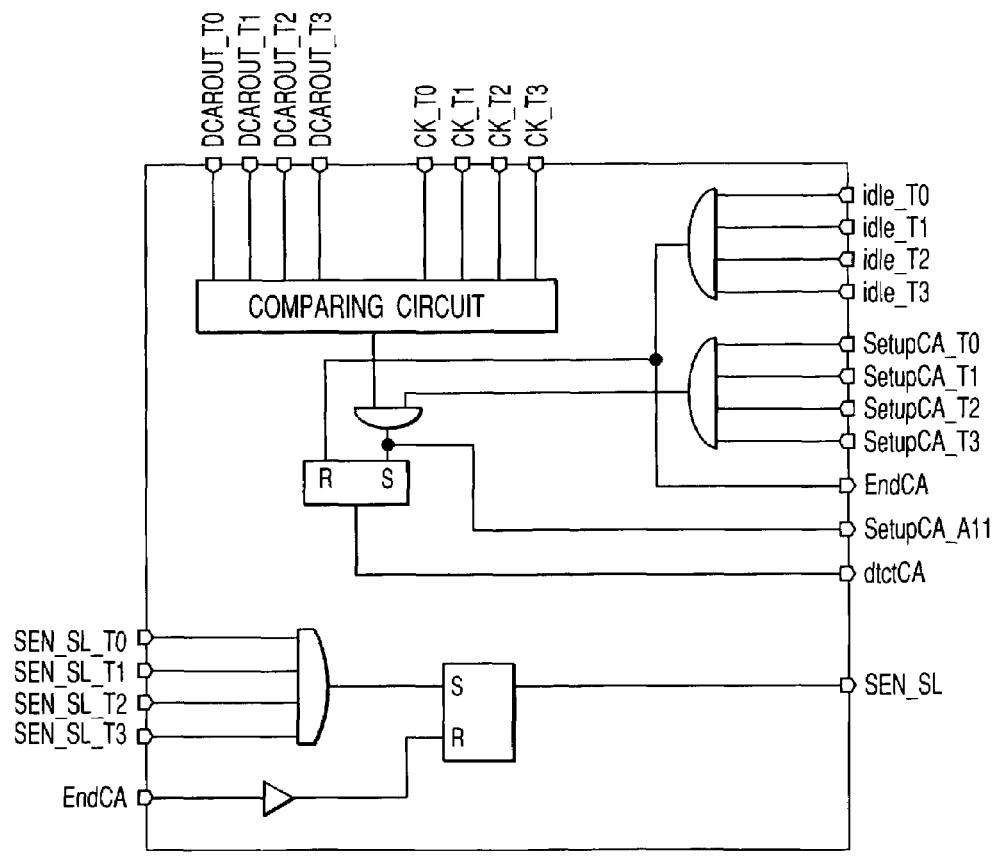
FIG. 7 is a block diagram illustrating an embodiment of a timing detecting circuit of FIG. 3.

FIG. 7 is a block diagram of an embodiment of the timing detecting circuit. This timing detecting circuit is provided to detect the clock generation timing. When the clock generating circuits of all clock phases (CK0 to CK3) are limited to SetupCA (SetupCA-T0 to SetupCA-T3), the signal SetupCA-A11 becomes active and the clock is generated depending on the value of the register in the respective clock phases. The signal SEN-SL is used to fetch the test data and data and changes depending on the specifications of test circuit and scanning FF.

Outputs CK-T0 to T3 (CK0 to CK3) of the frequency-dividing circuit for timing detection are compared with outputs DCAROUT-T0 to T3 of the setting register (DCAR) for the timing detection and a result is set to the RS-FF. In order to limit the condition for timing detection, state signals (idle-T0 to T3, Setup-T0 to T3, EndCA) are inputted from the clock generating circuit of each phase. An output of the RS-FF is the detection result (dtctCA).

Figure 8:
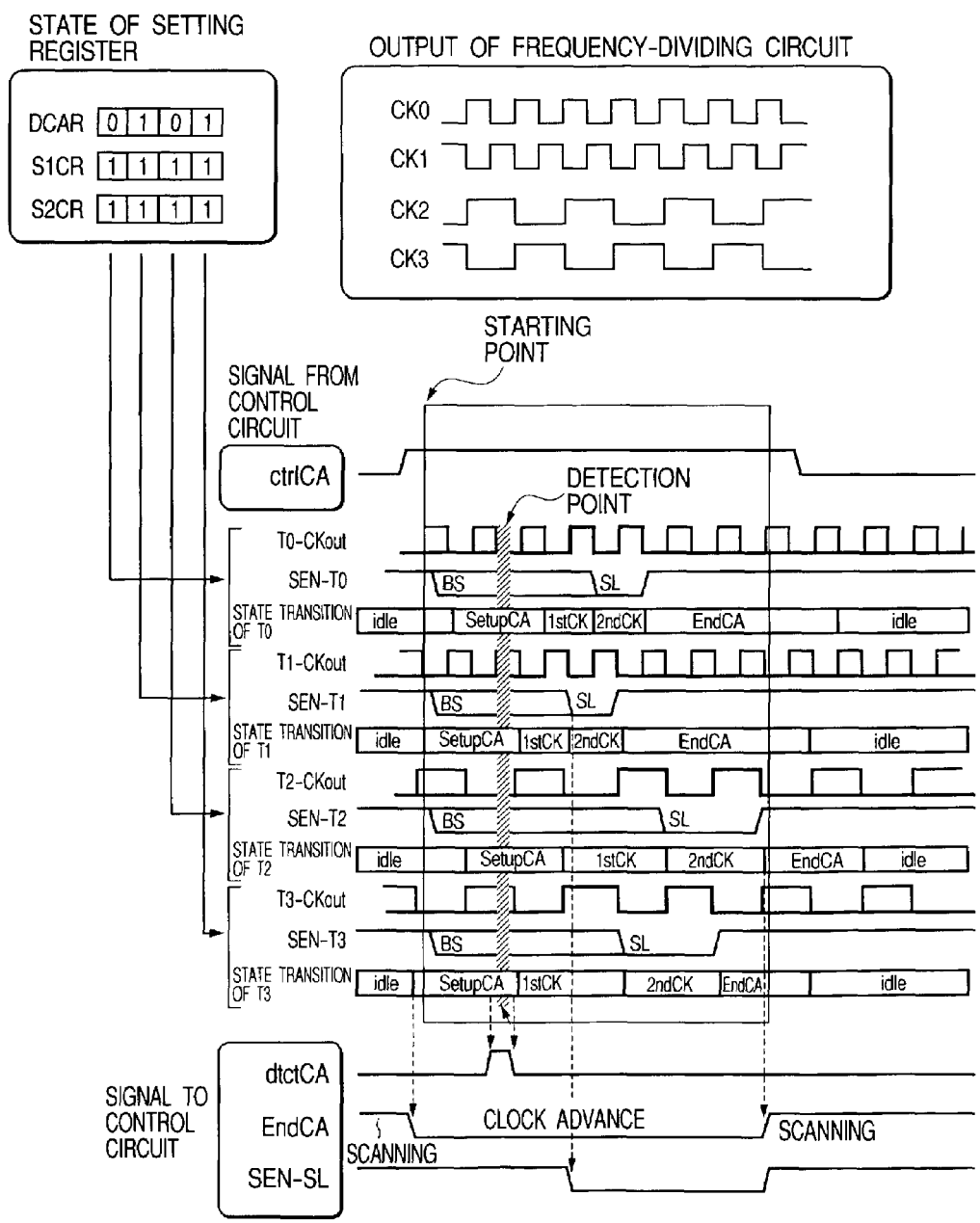
FIG. 8 is a timing diagram for explaining an example of the test operation using the test clock generating circuit of the present invention.

FIG. 8 is a timing diagram for explaining an example of test operation using the test clock generating circuit of the present invention. The test clock generating circuit is operated with the logic (high level) of the signal ctr1CA transferred from the scanning test control circuit as explained above. The timing detection in the timing detecting circuit is executed in this timing.

In the test operation of this embodiment, the logic stage of each phase is verified. Therefore, the first clock pulse and second clock pulse are respectively generated in the respective clock generating circuits T0 to T3. For the timing detection, when the register DCAR is set to 0101, the reference timing is defined when CK0 is 0, CK1 is 1, CK2 is 0 and CK3 is 1 and the signal dtctCA is generated corresponding to the detection point and the first clock pulse (1stCK) and the second clock pulse (2ndCK) are generated corresponding to the status transition of FIG. 4 in the respectively phases. The timing detection explained above is also used as the reference timing for the signal transfer among the difference clock phases explained later.

In this embodiment, employment of the system in which the fixed logic circuit such as the test clock generating circuit is used and the test conditions are set to the setting register provided in such logic circuit enables use of desired logic circuit and application of clock pulse used for such logic circuit and thereby makes reality the reduction of test design procedures. Moreover, since the clock pulse used actually is applied in direct, the AC test detection coefficient can be improved. Particularly, since the timing in the signal transfer among the logic circuits which are operated in different phases can be verified as will be explained later, the circuit test can be realized corresponding to the actual operation.

The test clock generating circuit for simplifying the test in this embodiment uses the same logic for each clock phase and therefore can be designed easily resulting in reduction of the design procedures. Since the clock generating sequence and generation timing are set up using parameters and these can be combined freely, restriction on the clocks in the logic design is rather small. Accordingly, the present invention is just suitable for design of various digital integrated circuit devices such as high speed CMOS circuit, ASIC or MPU, etc.

Figure 9:
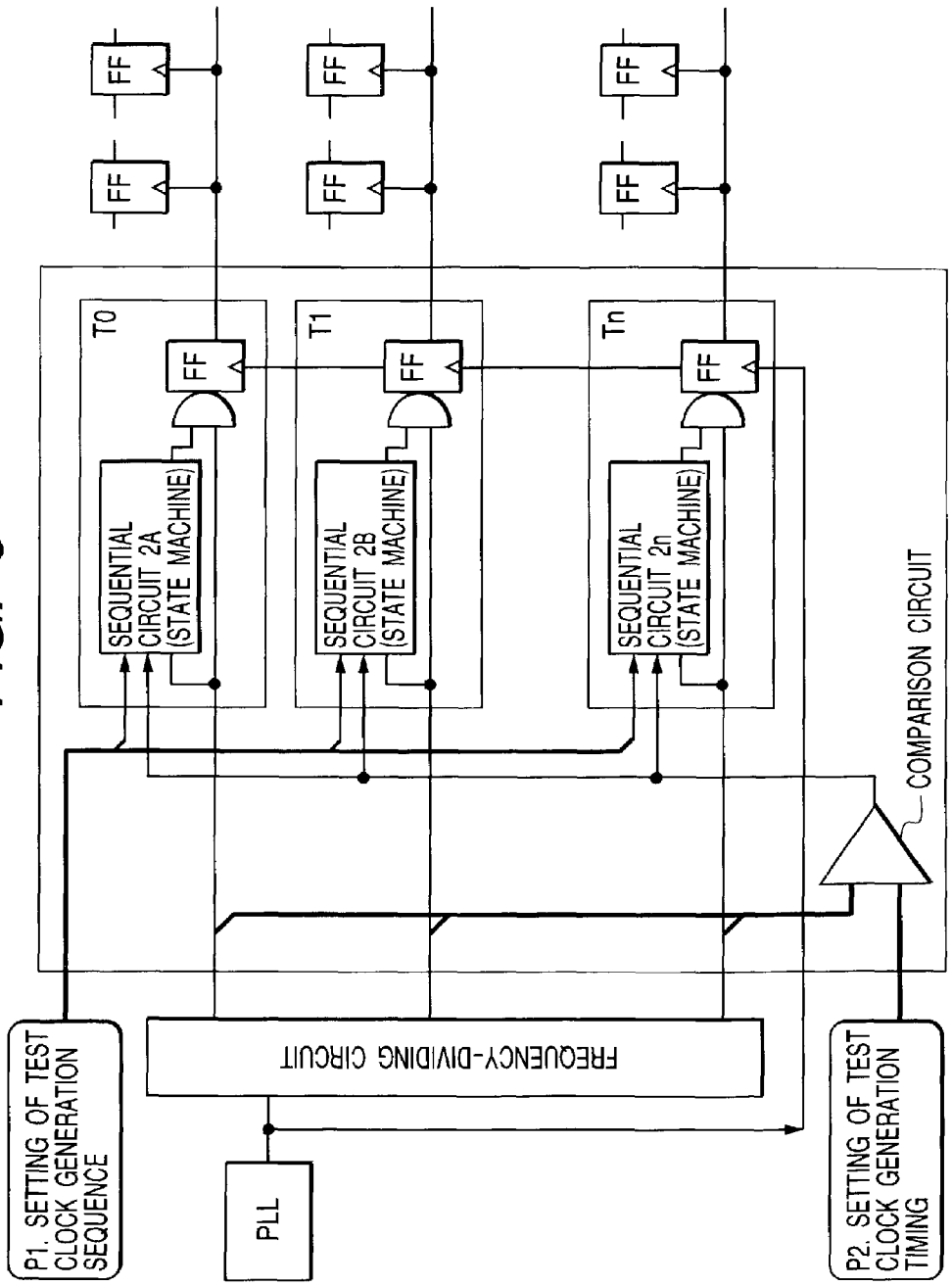
FIG. 9 is a block diagram of the essential portion illustrating another embodiment of the semiconductor integrated circuit device of the present invention.

FIG. 9 is a block diagram of the essential portion of the other embodiment of the semiconductor integrated circuit device of the present invention. In this embodiment, a modification example of FIG. 2 is introduced and a flip-flop FF is used in place of the gate for combining an input and an output of the clock generating circuit as the test simplifying circuit inserted between an output of the frequency-dividing circuit and the logic circuit. The clock pulse outputted from each phase is synchronized with the reference pulse formed by the PLL which is no longer influenced with a delay of signal transfer in each clock generating circuit and can also be used effectively when the clock frequency becomes high.

Figure 10:
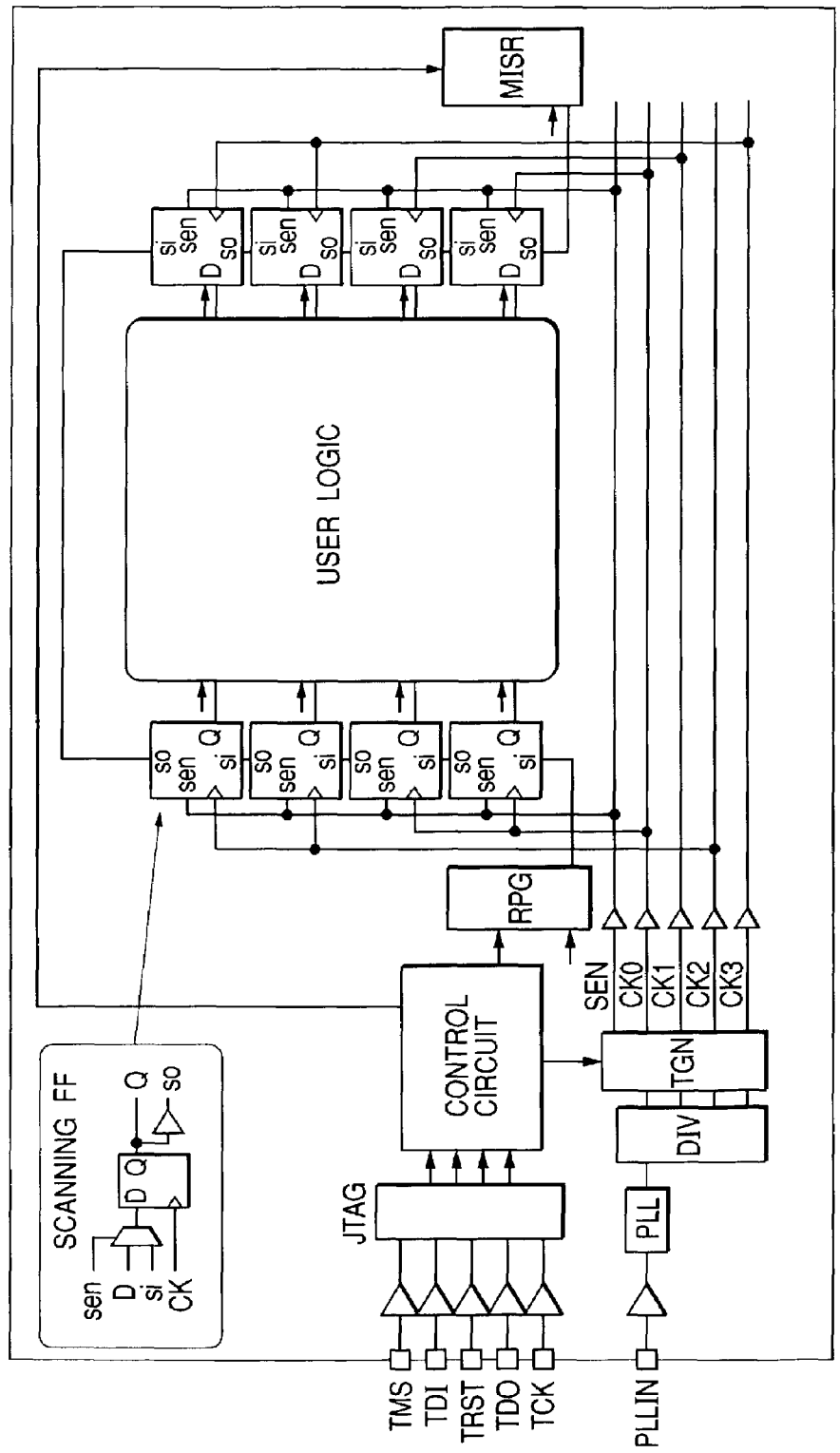
FIG. 10 is a total block diagram illustrating an embodiment of a semiconductor integrated circuit device to which the present invention is applied.

FIG. 10 is a total block diagram of an embodiment of the semiconductor integrated circuit device to which the present invention is applied. A flip-flop of user logic (hereinafter, referred to only as FF) is provided with an input switch circuit which is controlled with a signal sen. The input switch circuit transfers a signal D during the normal operation and a signal si during the scanning operation. In the scanning operation, each FF is connected in direct and a test pattern is inputted thereto from a random pattern generating circuit RPG.

The PLL circuit is synchronized with a pulse supplied from an external terminal PLLIN to form a pulse of the frequency which is higher than that of the pulse supplied. This pulse is frequency-divided with a frequency dividing circuit DIV to generate the four-phase clock pulses such as CK0, CK1, CK2 and CK3. The test clock generating circuit TGN in this embodiment is provided in the output part of the frequency-dividing circuit DIV in order to stop the clock pulse for the test operation and output the test clock in the required timing.

The terminals TMS, TDI, TRST, TDO, TCK are provided to control a JTAG and conform to the IEEE1149.1. Namely, the control circuit for test is accessed from the JTAG. The flop-flop circuits FFs for test are all scanning FF as explained above. The scanning FF connects, when the test circuit is formed, the scanning chain (so-si) among the adjacent scanning FFs. The terminal si of the initial stage FF of above chain is connected to a random number generator RPG. This random number generator RPG generates a test pattern used in the BIST. The terminal so of the final FF of chain is connected to a MISR. The MISR is a code compressor used in the BIST.

FIG. 11 is a total structure diagram of an embodiment of the semiconductor integrated circuit device of the present invention. This diagram illustrates each circuit block corresponding to the geometrical layout on a semiconductor substrate. Namely, this diagram is considered to illustrate a semiconductor chip structure. Since the test clock generating circuit TGN of the present invention is requested to provide a quick response, this circuit TGN is allocated near the frequency-dividing circuit.

Although not particularly restricted, a pair of PLL circuits are provided in right and left sides of a semiconductor chip and a pulse of which frequency is multiplied to a higher frequency therein is supplied to the frequency-dividing circuits 1 and 2. Corresponding to respective frequency-dividing circuits 1 and 2, the test clock generating circuit TGN of the present invention is provided. A setting information from the interface JTAG for test and control circuit CNTL of FIG. 10 is supplied to the test clock generating circuit TGN. In the interface JTAG for test, diagnostic pins are provided corresponding to the terminals TMS, TDI, TRST, TDO and TCK.

Between an output part of the test clock generating circuit TGN and each flip-flop of user logic, a clock tree consisting of a clock distribution circuit which provides an equal delay time to each flip-flop is provided. In the periphery of chip, an input/output interface circuit and a boundary scanning register extended along the interface circuit are allocated.

FIGS. 12(A), 12(B) and 12(C) are waveform diagrams for explaining the other embodiment of the test operation using the test clock generating circuit of the present invention. This embodiment is applied not only for verification of logic operations of logic circuit in each clock phase but also for verification of signal transfer among the logic circuits operated with difference clocks.

As illustrated in FIG. 12(A), the frequency-dividing circuit outputs the multi-phase clocks CK0, CK1, CK2 and CK3. In this embodiment, during the normal operation, six types of signal transfer in total of the basic system of the logic circuit operating CK0→GCK0 and additional systems of CK0→CK1, CK0→CK3 and CK2→CK0, CK2→CK1, CK2→CK3 are executed as illustrated in FIG. 12(B).

As illustrated in FIG. 12(C), during the test of the logic circuit, the test clock generating circuit of each phase outputs only the signal of single transfer operation in the scanning operation. Namely, the test clock generating circuit corresponding to CK0 outputs two pulses of 1stCK and 2ndCK, while the test clock generating circuit corresponding to CK1 outputs only one pulse 1stCK and the test clock generating circuit corresponding to CK2 and CK3 output only one pulse 1stCk.

In other words, the clocks indicated with the mark X are inhibited to be outputted from respective test clock generating circuits and are erased. Accordingly, in the signal transfer between the logic stage and the logic circuits of different clock phases, it is inhibited that the clocks other than the clock of single transfer are transferred, it can also be prevented that a test result in the predetermined timing is destroyed with the subsequent clocks and thereby input of test pattern can be realized with the preceding and subsequent scanning operations and collection of the corresponding output patterns can also be realized. As a result, total timings of the logic circuit which is operated with the multi-phase clocks can be verified with the clocks used for actual operation and a fault detection coefficient can also be enhanced.

Figure 13:
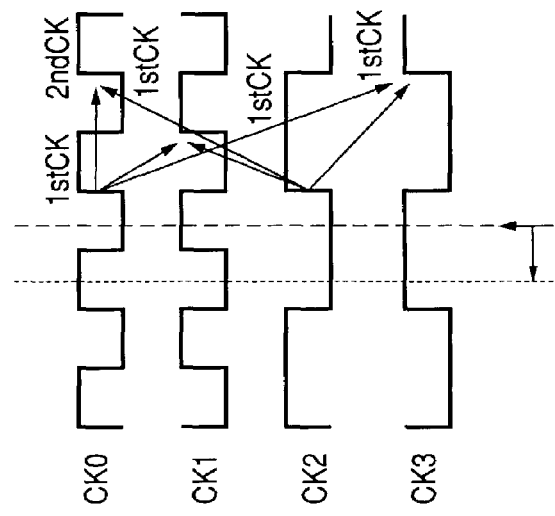
FIG. 13 is a waveform diagram for explaining a method of setting test parameters corresponding to FIG. 12.

FIG. 13 is a waveform diagram for explaining the method of setting the test parameters. When the setting register DCAR is set to 0101, the clock waveform CK0 generates the two clocks of 1stCK and 2ndCK, while clock the waveforms CK1, CK2, CK3 generate only the clock of 1stCK under the condition that the clock generation timings of the clock waveforms CK0, CK1, CK2, CK3 are respectively 0, 1, 0, 1. The transfer mode explained above can be satisfied before execution of the test by setting these timings as the parameters. When the setting value CK1→0 of the setting register DCAR is changed, the detection timing is set to the timing about a half-period before the clock CK1. When this timing is requested to be set to the transfer mode, the waveform CK1 can be controlled to generate only the clock of 2ndCK. As explained above, various combinations may be realized corresponding to the setting information of the registers DCAR and S1CR, S2CR.

Figure 14:
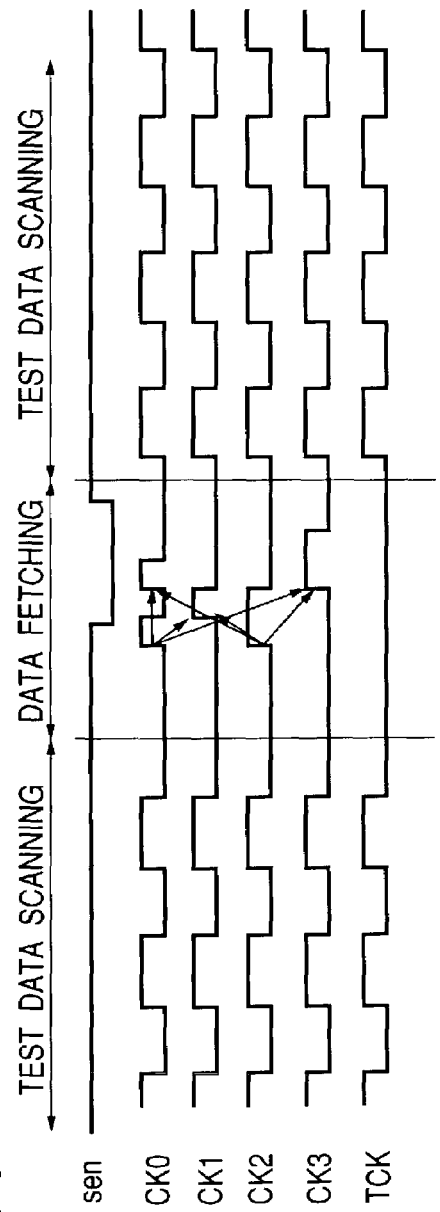
FIG. 14 is a waveform diagram for explaining clock operation during the test using the test clock generating circuit of the present invention.

FIG. 14 is a waveform diagram for explaining the clock operation in the test mode when the test clock generating circuit of the present invention is used. During the scanning mode, the clocks are uniformly impressed from the external pin TCK and the clock mode is switched to the multi-phase clock of the frequency-dividing circuit when the data is fetched. The switched clock is controlled with the clock generating circuit and only the desired clocks are outputted.

Figure 15:
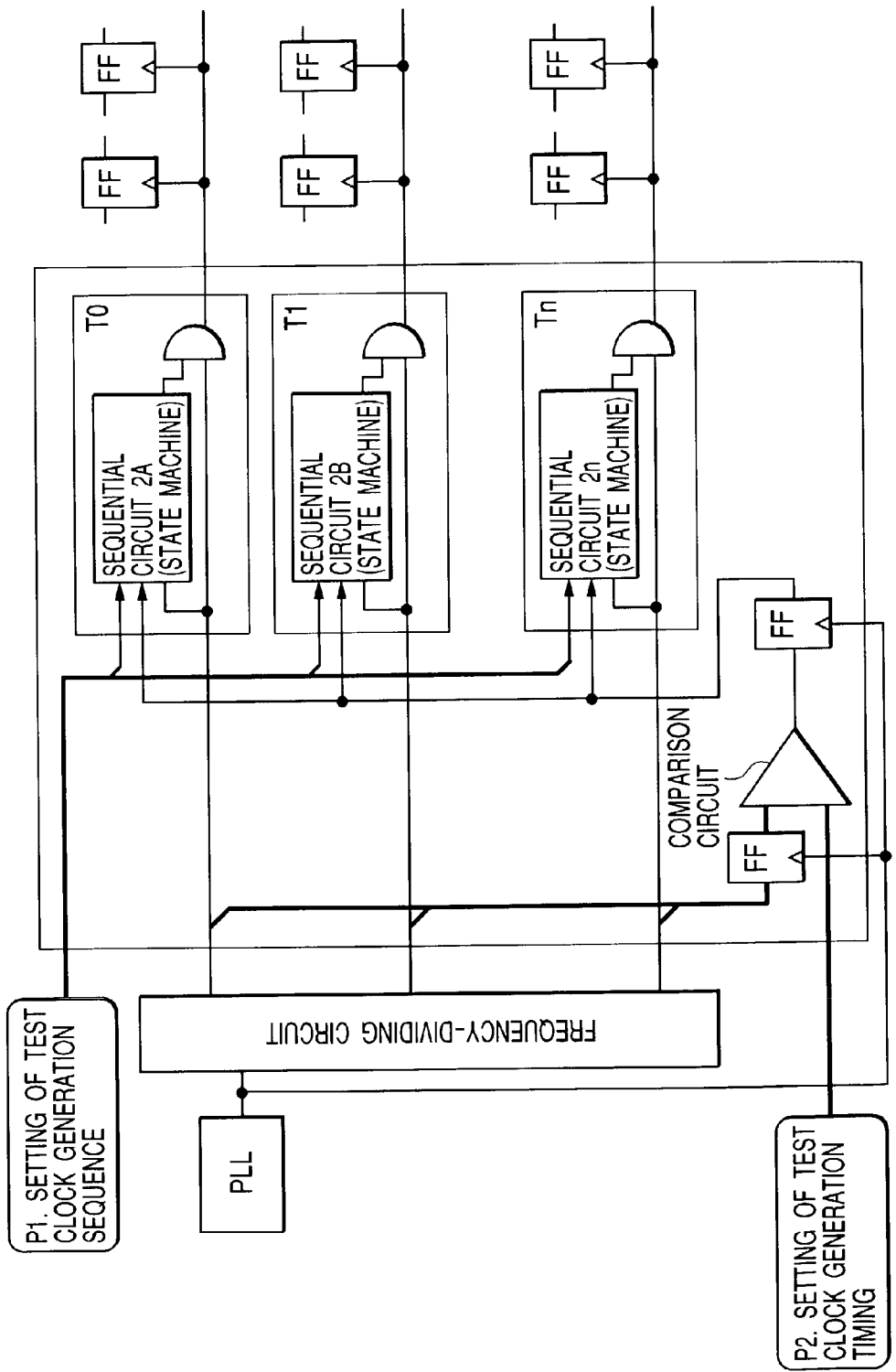
FIG. 15 is a block diagram of the essential portion illustrating the other embodiment of the semiconductor integrated circuit device of the present invention.

FIG. 15 is a block diagram of the essential portion as the other embodiment of the semiconductor integrated circuit device of the present invention. This embodiment is a modification example of FIG. 2, wherein the time required for comparison can be shortened by connecting a flip-flop before or after the comparing circuit.

Figure 16:
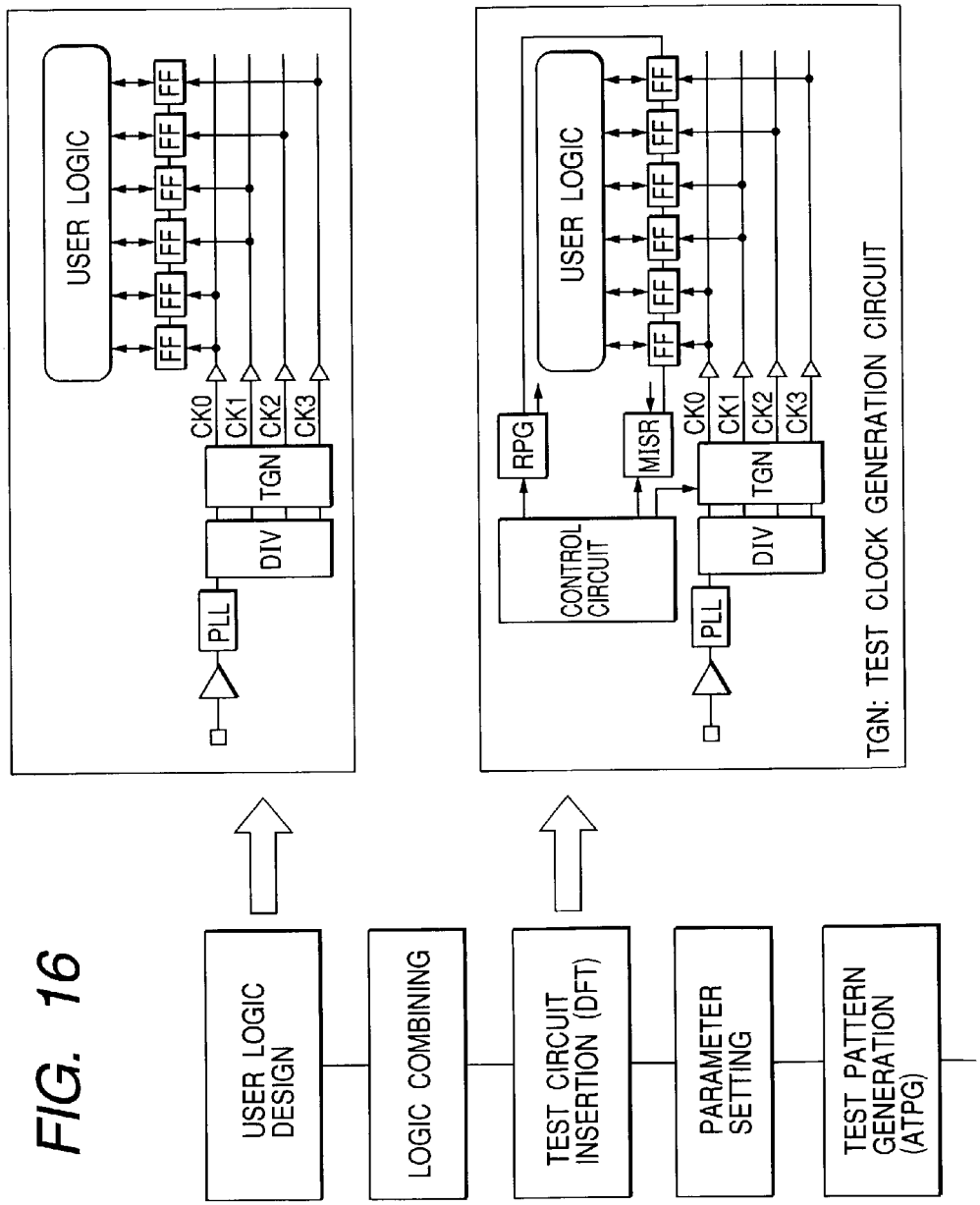
FIG. 16 is a diagram for explaining an embodiment of the method of designing the semiconductor integrated circuit device of the present invention.
Figure 17:
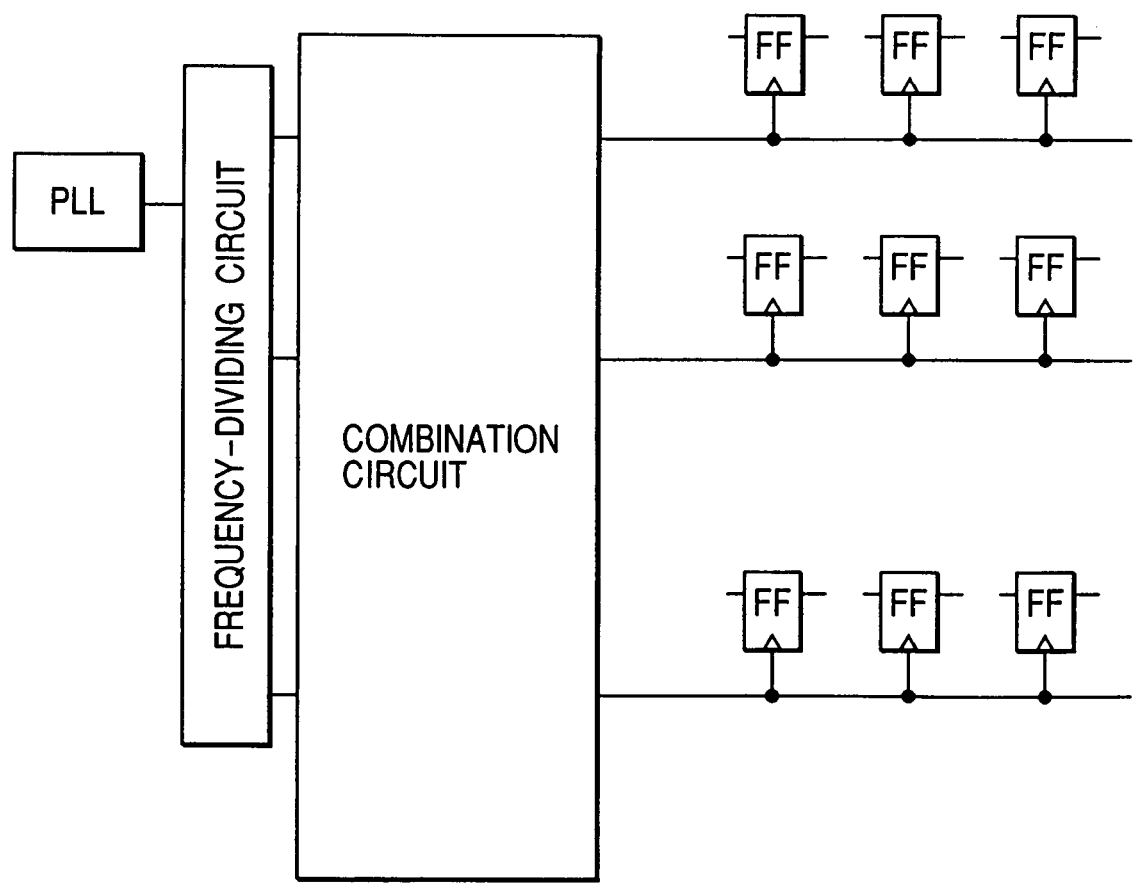
FIG. 17 is a block diagram illustrating an example of the test circuit discussed prior to the present invention.

FIG. 16 is a diagram for explaining an embodiment of a method of designing the semiconductor integrated circuit device of the present invention. The desired user logic can be designed using a logic design tool. Namely, in this logic design, the PLL circuit and frequency-dividing circuit DIV are built in and the multi-phase clocks such as desired clocks of CK0, CK1, CK2, CK3 or the like are supplied to the flop-flop FF of the user logic.

When the user logic design is completed, the logic circuits are combined for conversion into the logic of gate level. Thereafter, a test circuit including the test clock generating circuit TON is inserted to generate a test pattern which is generated after the parameters for clock generation are set. In this test pattern, a timing fault is also detected in addition to the logic fault and thereafter the test step is returned to the step for setting the logic in order to correct the circuit. As explained above, since the circuit can be verified, with inclusion of timing fault, on the logic design tool, the fabrication cost can be lowered and the development period can also be shortened.

Figure 18:
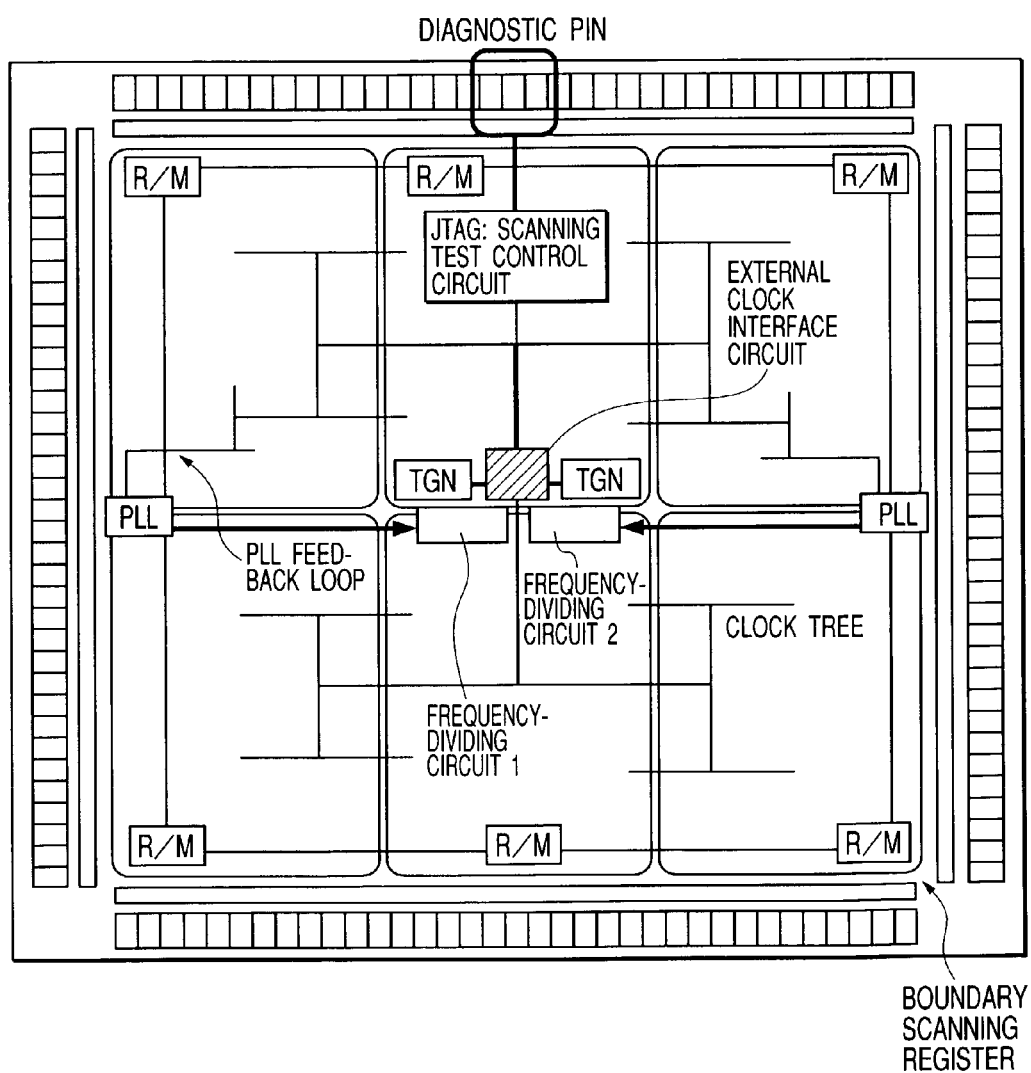
FIG. 18 is a total structure diagram illustrating the other embodiment of the semiconductor integrated circuit device of the present invention.

FIG. 18 is a total structure diagram of the other embodiment of the semiconductor integrated circuit device of the present invention. In this figure, each circuit block is illustrated following the geometrical layout on a semiconductor substrate as in the case of FIG. 11 and the test clock generating circuit TGN is allocated in the periphery of the frequency-dividing circuit because it is requested to operate at a high speed. The part not explained in the embodiment of FIG. 11 and the part different from such embodiment will be explained below.

As explained above, the semiconductor integrated circuit device of this embodiment is provided with a signal transfer system in which the clock pulses are supplied in the equal time delay to each flip-flop circuit FF of the logic stage. Namely, the frequency-dividing circuits 1, 2, test clock generating circuit TGN and external clock interface circuit are allocated at the center of chip, the clock buffers, for example, of the clock wirings of the equal length and of the same number of stages are combined with the external clock interface circuit defined as the starting point and the clock pulses are transferred in the equal delay time. Thereby, the clock pulses having the equal transfer delay time are supplied in the flip-flop circuits FFs forming the logic circuit to receive the clock pulses.

In the same figure, the signal transfer system of clock pulses is depicted as a diagram to form an H-tree. Namely, the H-tree has a structure that it is extended in the same distance in both sides of the external clock interface circuit and is also extended in the same distance in both sides in the right-angle direction thereof at the terminal area. A clock buffer is allocated, although not illustrated, at each branching part of the H-tree. The clock pulse at the terminal of the signal transfer system, namely at the clock supply node of the flip-flop circuit FF or at the dummy supply node thereof is inputted to the PLL circuit as the PLL feed-back signal.

Therefore, the PLL circuit synchronizes the reference clock supplied from an external circuit and the clock to be supplied to the flip-flop circuit FF.

The external clock interface circuit is usually provided for the clock and test clock to use in common the clock supply wiring consisting of the H-tree explained above. For such operations, the clock must be selected depending on the scanning test control condition. A logic block is provided for this purpose. In the external clock interface circuit, the three kinds of clocks, "normal clock", "internally generated clock" and "externally applied clock" may be selected. The SEN generating circuit explained later is a scanning enable signal generating circuit and is used to use the externally applied test clock. The test clock generating circuit TGN generates, as explained above, the test clock from the clock of the rate approximated to the actual operation rate supplied through the PLL/frequency-dividing circuit.

In this embodiment, the JTAG/scanning-test control circuit is designed in a little larger physical size and is therefore usually requested to allocate in the empty area of the operation logic. In this figure, this circuit is allocated near the diagnostic pin. Since the test clock generating circuit has a function to generate the test clock from an output of the frequency-dividing circuit, it is allocated near the frequency-dividing circuit. Since the external clock interface circuit has a clock selection function, it is requested to allocate at the root area of the clock tree. In this embodiment, the root of clock tree is located at the center of chip, the external clock interface circuit is also allocated at the center of chip.

The external clock interface circuit is a block realized only to have the clock selection function. Therefore, the number of gates is lesser than the scanning test diagnostic circuit and this circuit requires only a small area even when it is allocated at the root of clock tree (center of chip). In this embodiment, three blocks forming the diagnostic control logic (frequency-dividing circuit/test clock generating circuit, external clock interface circuit, JTAG/scanning test control circuit) may be allocated independently.

Figure 19:
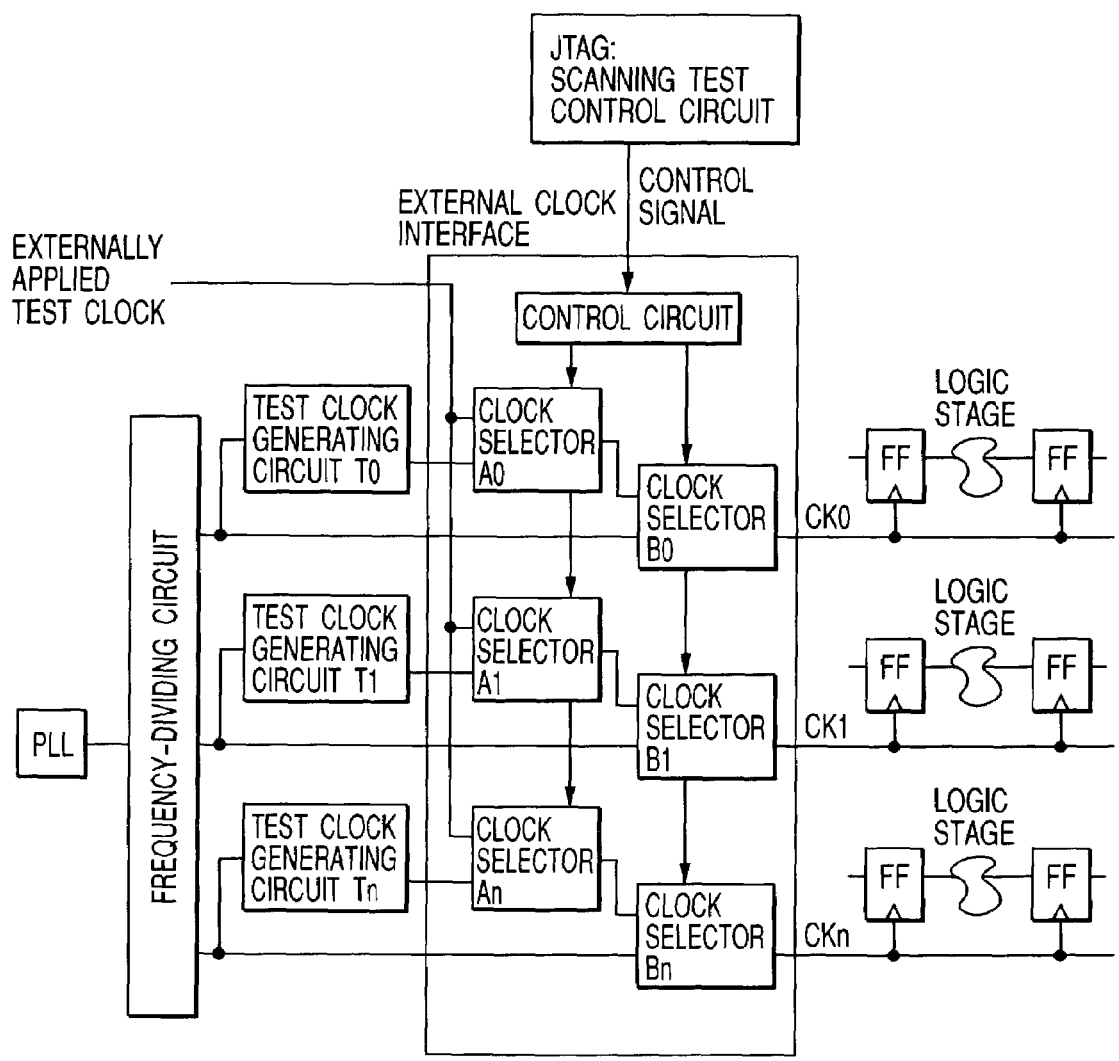
FIG. 19 is a block diagram illustrating an embodiment of an external clock interface circuit of FIG. 18.

FIG. 19 is a block diagram of an embodiment of the external clock interface circuit. In this figure, respective circuits in relation to the external clock interface circuit are also illustrated. The external clock interface circuit is formed of combination of two clock selectors A and B for one clock pulse. For example, the test clock generated with the test clock generating circuit T0 and the externally applied test clock are selected with the clock selector A0. The test clock selected with the clock selector A0 and the clock pulse formed with the corresponding frequency-dividing output are selected with the clock selector A0 and is then outputted as CK0. The clock selectors A1 to An and A1 to Bn are provided corresponding to the test clock generating circuits T1 to Tn corresponding to the clocks of the frequencies or phases different from that of the clock pulse explained above formed in the frequency-dividing circuit. Therefore, the clocks CK1 to CKn are outputted in the same manner.

Figure 20:
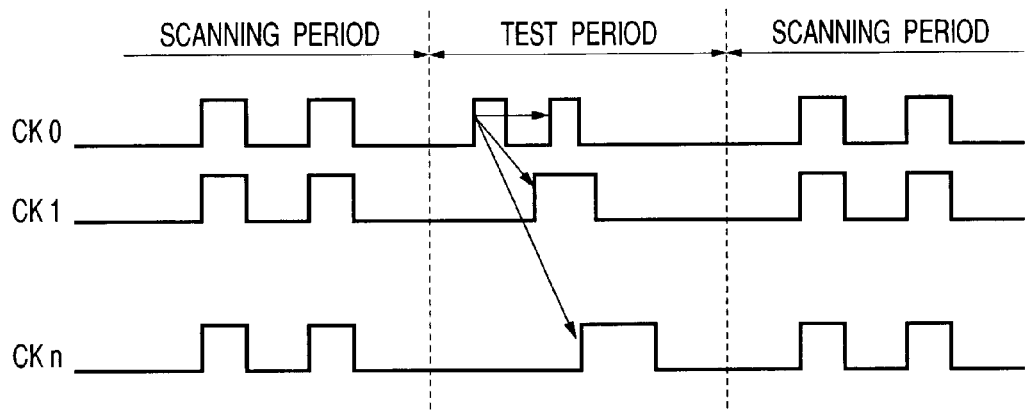
FIG. 20 is a waveform diagram for explaining an embodiment of the operations of the external clock interface circuit of FIG. 19.

During the scanning shift for inputting the test pattern to the flip-flop circuit FF of the logic stage, the externally applied test clock is selected with the clock selectors A0 to An and the test mode is set with the selectors A0 to Bn in order to select the externally applied test clock explained above. Namely, as illustrated in FIG. 20, all flip-flop circuits FFs are caused to uniformly output the same clock as the clock for scanning shift in the scanning mode for inputting the input pattern. During the test mode of the logic stage, the clock selectors A0 to An are switched for the test clocks formed in the test clock generating circuits T0 to Tn and output the test clocks depending on the respective clock phases. The logic output pattern of the logic stage corresponding to such input pattern is then switched to the same clock and is also collected by the scanning operation. FIG. 20 is identical to FIG. 14.

During the scanning shift explained above, the clock selectors A, B are controlled to output the externally applied test clock. During this test mode, when the externally applied test clock is used and when the test clock generated with the clock generating circuit is used, the clock selectors A and B are controlled to output the preset clock. In regard to the clock selected during the logic function test, this clock can be set freely by previously writing the predetermined information before the execution of test to the test generating circuit and the setting register comprised in the external interface circuit.

The external clock interface circuit and test clock generating circuit operate to receive a control signal for switching the clock timing from the scanning test diagnostic circuit and to select the adequate clock depending on the timing thereof. The clock to be selected is determined by referring to contents of the comprised setting register as explained above. During the normal operation, the clock selector B is controlled to output in direct the clock from the frequency-dividing circuit.

Figure 21:
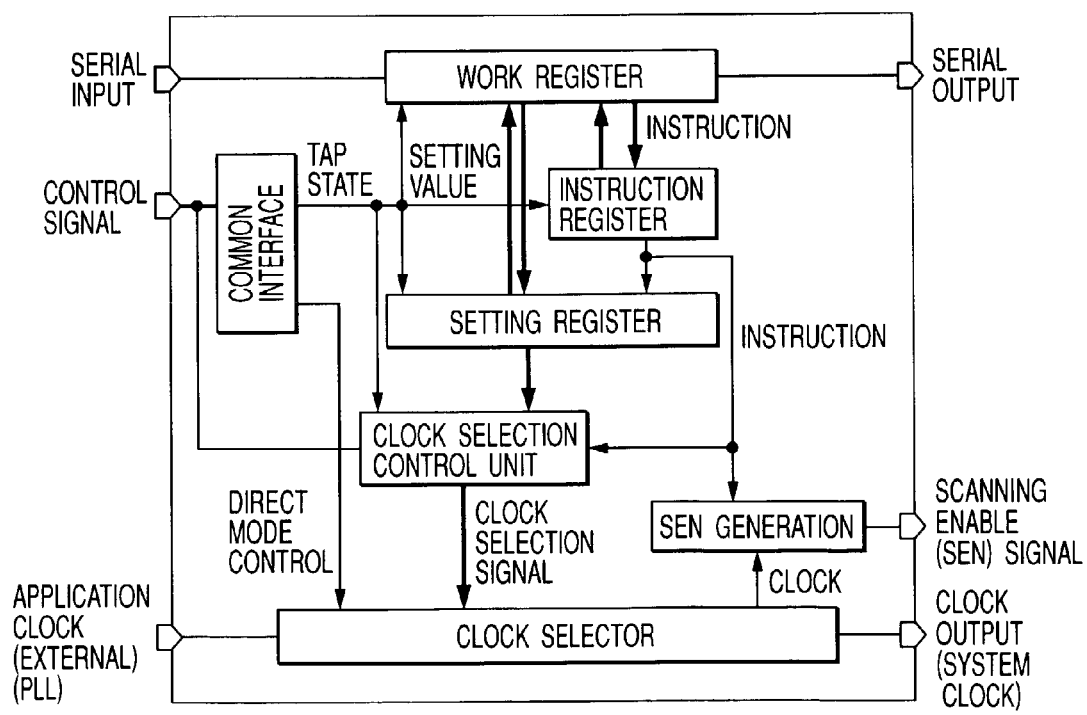
FIG. 21 is a block diagram illustrating an embodiment of the external clock interface circuit of FIG. 19.

FIG. 21 is a block diagram of an embodiment of the external clock interface circuit. An instruction register stores the instructions being executed at present. The setting register stores designation of clock selected under each condition. A clock selector is actually an aggregation of selectors for the clock and the logic is optimized. The common interface is a logic circuit to receive the control signal from the control unit itself. The clock selection control unit generates a clock selection signal to a selector control unit depending on instructions and various setting contents. The SEN generating unit generates a scanning enable (Scan Enable) signal for distribution to exclusive scanning circuit FF for MUXSCAN as illustrated in FIG. 10.

The clock to be selected is previously set to the setting register during execution of test in the external clock interface circuit and when the data is stored in the instruction register the circuit operates depending on the contents. When the test is started, the clock is selected by referring to contents of the setting register and the test is then executed.

Figure 22:
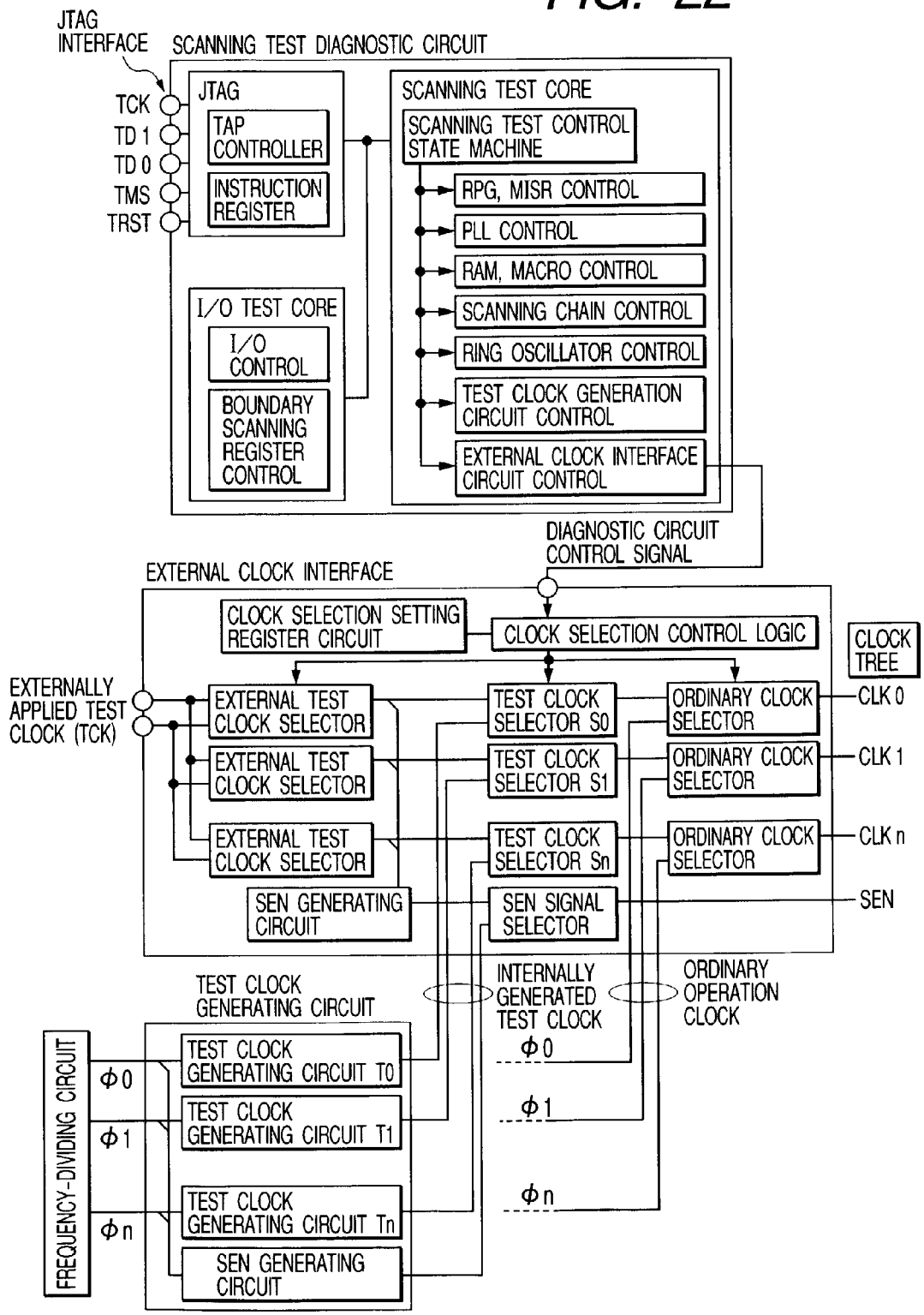
FIG. 22 is a total block diagram illustrating an embodiment of a diagnostic control logic circuit to be loaded to the semiconductor integrated circuit device of the present invention.

FIG. 22 is a total block diagram of an embodiment of the diagnostic control logic circuit loaded to the semiconductor integrated circuit device of the present invention. The diagnostic logic circuit is composed, as explained above, of the scanning test diagnostic circuit, external clock interface circuit and test clock generating circuit.

The scanning test diagnostic circuit comprises therein a state machine for the JTAG/control and executes the controls required for the scanning test. The I/O, boundary scanning, macro such as RAM, RPG and MISR are controlled depending on the state of the JTAG and scanning test control state machine. Moreover, this scanning test diagnostic circuit also executes the synchronous control for the timing of the external clock interface and test clock generating circuit and is also provided with a control logic for such synchronous control.

Since the external clock interface uses in common only one clock wiring for the normal clock and test clock, the clock must be selected depending on the control condition of scanning test and a logic block is also provided for this purpose. The external clock interface circuit is capable of selecting three kinds of clocks of "normal clock", "internally generated clock" and "externally applied clock". The SEN generating circuit generates the scanning enable signal and is used to use the externally applied test clock. The test clock generating circuit generates, as explained above, the test clock from the clock of the rate near the actual operation rate supplied through the PLL/frequency-dividing circuit.

Figure 23:
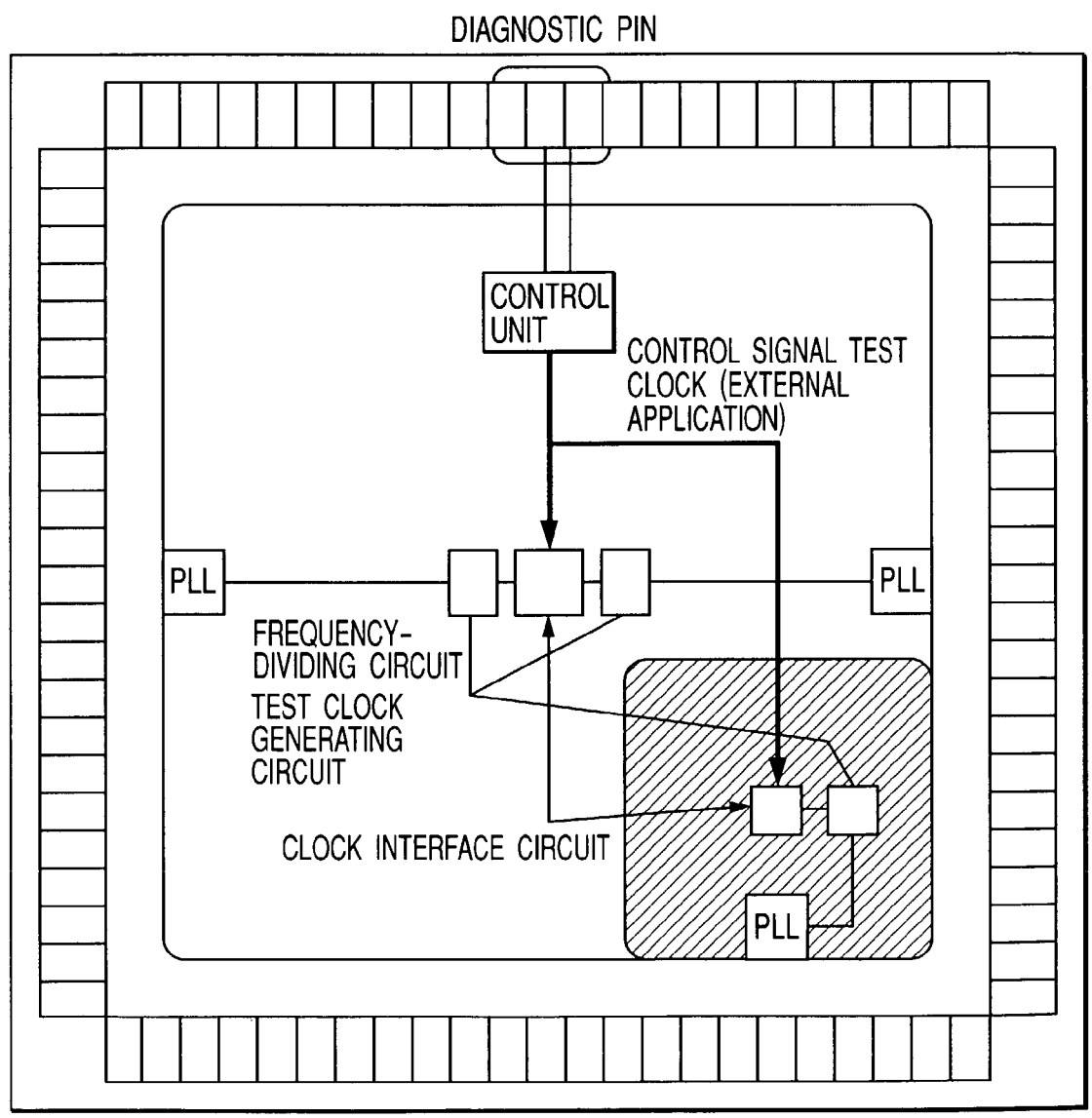
FIG. 23 is a total structure diagram illustrating the other embodiment of the semiconductor integrated circuit device of the present invention.

FIG. 23 is a total structure diagram of the other embodiment of the semiconductor integrated circuit device of the present invention. This figure illustrates each circuit block in relation to the geometrical layout on the semiconductor substrate. In this embodiment, an example of layout of a plurality of clock interface circuits of each clock block is illustrated. Moreover, the circuit which operates with the individual clock is also provided in the periphery in the semiconductor chip as illustrated in the hatched area. In this peripheral block, the frequency-dividing circuit and test clock generating circuit are allocated at the center and the external clock interface circuit is also arranged corresponding to these circuits.

As explained above, the clock interface circuit is inserted to the root area of each clock tree. Control signals to each clock interface circuit are distributed from the control unit itself consisting of the scanning test diagnostic circuit as illustrated in FIG. 22. The control unit itself and each clock interface circuit are operated synchronously with the common diagnostic clock. Accordingly, even when the starting position of the clock tree is different, synchronization with the other clock blocks can be realized easily and the chip as a whole can also be tested in the same timing.

Since the external clock interface circuit of the present invention as explained above forms the logics only for the functions required for control of clocks, the circuit itself is smaller than the control unit itself. Therefore, since the optimized clock interface circuit as a whole can be inserted to the starting point of the clock tree, increase of skew can be controlled even when the selector functions are added. Since several signals indicating the TAP conditions are supplied from the control unit itself, the number of wirings can also be controlled.

In the MUXSCAN system corresponding to multi-phase clock, complicated operations for controlling clock waveform depending on the transfer mode of data for each clock phase are required as illustrated in FIG. 14 and FIG. 20. On the other hand, the root area of clock tree of the semiconductor integrated circuit device LSI is located in a plurality of areas as illustrated in FIG. 23. When the control logic is concentrated to only one area, a plurality of control signals are distributed to each clock control logic and management of delay time is rather complicated. Particularly, in the logic for management of clocks, since the strict timing design is required, much labor is required for the timing design in relation to the control block.

Since the timing of the diagnosis is strict for the control of clock, an independent exclusive block is prepared in the present invention. In such independent external clock interface circuit, the setting register is respectively provided for selection of instruction register and clock, control can be realized at the area near the clock because this block itself has the control logic, making easier the timing management including the delay of signal. Moreover, the TAP condition required for control can be distributed with a plurality of control signals from the diagnostic control unit itself. This distribution method is more advantageous in the cost of wiring than the system for distributing the control signal to each clock selector from the diagnostic control circuit.

Since the special independent block is provided for clock control as explained above, the timing design can be realized easily and detail control logics can be prepared depending on the setting for each type of test. Moreover, since the timing design of test clock becomes easier, a proper measure can also be provided for high speed test. In addition, special test clock can also be used for each block because the control logic is provided for each clock block.

As explained above, the present embodiment can provide following effects.
(1) High performance test operation can be realized by providing the test clock generating circuit provided with the register sequential circuit and clock transfer control circuit between the pulse generating circuit and the logic circuit, suspending transfer of clock pulse formed in the pulse generating circuit to the logic circuit when the test operation is validated, and controlling the clock transfer control circuit with the sequential circuit depending on the setting information of the register to output the clock pulse to operate the logic circuit using the clock pulse generated in the pulse generating circuit.
(2) Logic verification can be realized including the timing in the logic stage conforming to the actual operation by suspending transfer of clock pulse generated in the pulse generating circuit to the logic circuit with the clock transfer control circuit when the test operation is validated in the test clock generating circuit and by transferring, to the logic circuit, the first clock pulse and second clock pulse formed in the pulse generating circuit by controlling the clock transfer control circuit with the sequential circuit depending on the setting information of the register.
(3) In addition to above effects, signal transfer between logic circuits operating in different clock phases can be verified in addition to the test in each clock phase by forming a plurality of multi-phase clock pulses corresponding to a plurality of logic circuits with the pulse generating circuit for a plurality of logic circuits operating in different phases or frequencies and by controlling the test clock generating circuit to output the clock pulse corresponding to the signal transfer between the logical circuits operating in different clock pulses by controlling the clock transfer control circuit with the sequential circuit depending on the detection signal of the timing detecting circuit and the setting information of register when the test operation is validated for the logic circuits including the timing detecting circuit corresponding to a plurality of logic circuits.
(4) While the logic circuit realizes high speed operation, the test can be realized with the pulse corresponding to such operation by including, to the pulse generating circuit, the PLL circuit to form the pulse signal having the higher frequency for the pulse signal supplied from the external terminal.
(5) Setting for test can be performed easily by providing, to the semiconductor integrated circuit device, the scanning circuit for supplying a test pattern to the first flip-flop circuit provided in the input side of the logic circuit and also providing the second flip-flop circuit provided in the output side of the logic circuit.
(6) Fabrication cost can be lowered and development period can also be shortened by designing logic circuit for realizing desired logic functions and a pulse generating circuit for generating clock pulse required for the operation thereof on the logic design tool utilizing a computer and comprising the test clock generating circuit, provided with the register sequential circuit and clock output control circuit, for suspending transfer of clock pulse formed in the pulse generating circuit to the logic circuit when the test operation is validated and controlling the clock transfer control circuit with the sequential circuit depending on the setting information of the register to output the clock pulse for operation of logic circuit using the clock pulse signal formed in the pulse generating circuit and executing the test of logic circuit function and timing margin with the test clock generating circuit.

(7) The logic circuit having the high speed operation characteristic can be designed effectively by including, into the pulse generating circuit, the PLL circuit to form the pulse signal having higher frequency for the pulse signal supplied from the external terminal.

(8) Since the special independent block is provided for clock control, the timing design can be realized easily and detail control logics can be prepared depending on the setting for each type of test, a proper measure can also be provided for high speed test. Moreover, since the control logic is provided for each clock block, the particular test clock can be used for each block.

The present invention has been explained practically based on the embodiments thereof but the present invention is never restricted thereto and allows various changes of modifications without departing from the scope of the invention. Any type of practical structure of the test clock generating circuit may be used when it includes the first clock and second clock as illustrated in FIG. 4.

The present invention can be utilized widely as the means for controlling the test clock during the test by inserting the test simplifying circuit to the user clock in the logic circuit designed on the LSI and as the means for controlling the test clock through synchronization not only among the same clock phases but also among different clock phases by providing the test clock generating circuit for each phase and the comparing circuit for detecting the desired condition of the clock phase and applying the matching signal of the comparing circuit to the test simplifying circuit in the logic circuit which has the sequential circuit operating with the clock same as that used for actual operation, controls the test clock generation sequence by adequately controlling application of the user clock depending on the input condition from the external circuit using the sequential circuit and is being formed of the multi-phase clocks outputted from the synchronously designed frequency-dividing circuits.

The typical profiles of the present invention can also provide the following effects.

High performance test operations can be realized by providing the test clock generating circuit provided with the register sequential circuit and clock transfer control circuit between the pulse generating circuit and logic circuit and by suspending, when the test operation is validated, the transfer of clock pulse formed in the pulse generating circuit to the logic circuit and controlling the clock transfer control circuit with the sequential circuit depending on the setting information of the register to output the clock pulse to operate the logic circuit using the clock pulse formed in the pulse generating circuit.

Fabrication cost can be lowered and development period can also be shortened by designing logic circuit for realizing desired logic functions and a pulse generating circuit for generating clock pulse required for the operation thereof on the logic design tool utilizing a computer and incorporating the test clock generating circuit, provided with the register sequential circuit and clock output control circuit, for suspending transfer of clock pulse formed in the pulse generating circuit to the logic circuit when the test operation is validated and controlling the clock transfer control circuit with the sequential circuit depending on the setting information of the register to output the clock pulse for operation of logic circuit using the clock pulse signal formed in the pulse generating circuit and executing the test of logic circuit function and timing margin with the test clock generating circuit.

What is claimed is:

1. A semiconductor integrated circuit device comprising:
   a PLL circuit;
   a frequency-dividing circuit;
   a first setting register circuit which holds first data;
   a timing detecting circuit;
   clock generation circuits comprising sequential circuits and gates; and
   logic circuits each of which comprises logic paths of a flip-flop—a logic stage—a flip-flop;
   wherein the PLL circuit is synchronized with an externally supplied clock pulse and generates an internal clock from the externally supplied clock pulse;
   wherein the frequency-dividing circuit generates test clock pulses with at least one of plural different phases and frequencies from the internal clock;
   wherein the test clock pulses pass through the gates to the flip-flops when the gates open;
   wherein the sequential circuits control opening and closing of the gates according to status transitions of the sequential circuits;
   wherein the sequential circuits concurrently transit to a predetermined state to open the gates, when the timing detecting circuit detects that the values of the test clock pulses correspond with the first data; and
   wherein the gates open in the predetermined state.

2. The semiconductor integrated circuit device according to claim 1,
   wherein the sequential circuits concurrently transit to the predetermined state when the timing detecting circuit detects that the values of the test clock pulses correspond with the first data and output a timing detecting signal to the sequential circuits.

3. The semiconductor integrated circuit device according to claim 1,
   wherein a test pattern is supplied to the flip-flops in the front side of the logic stages under a condition that supply of the test clock pulses are stopped.

4. The semiconductor integrated circuit device according to claim 1, further comprising:
   a second setting register circuit; and
   a third setting register circuit;
   wherein the second and third setting register circuits hold second data and third data respectively;
   wherein the sequential circuits transit to a first state when the timing detecting circuit detects that the values of the test clock pulses correspond with the second data;
   wherein the gates open and first test clock pulses pass through the gates to the flip-flops in the first state, if the second data is a predetermined value;
   wherein the sequential circuits transit to a second state after the first state; and
   wherein the gates open and second test clock pulses pass through the gates to the flip-flops in the second state, if the third data is a predetermined value.

5. The semiconductor integrated circuit device according to claim 4,
   wherein the flip-flops in the front stage output a test pattern fetched beforehand to the logic stages with the first test clock pulses,
   wherein the logic stages execute logic processes corresponding to the test pattern and transfer results to flip-flops in the next stage of the logic stages; and the flip-flops fetch the results from the logic stages with the second test clock pulses.

6. The semiconductor integrated circuit device according to claim 1, wherein the first data is rewritable.

7. A semiconductor integrated circuit device comprising:
a PLL circuit;
a frequency-dividing circuit;
a first, second and third setting register circuits each of which hold first, second and third data;
a timing detecting circuit;
clock generation circuits comprises sequential circuits and gates; and
logic circuits each of which comprises a logic path of a flip-flop—a logic path—a flip-flop;
wherein the PLL circuit is synchronized with an externally supplied clock pulse and generates an internal clock from the externally supplied clock pulse;
wherein the frequency-dividing circuit generates test clock pulses with at least one of plural different phases and frequencies from the internal clock;
wherein the test clock pulses pass through the gates to the flip-flops when the gates open;
wherein the sequential circuits control opening and closing of the gates according the status transitions of sequential circuits;
wherein the sequential circuits transit to a first state when the timing detecting circuit detects that the values of the test clock pulses correspond with the first data;
wherein the sequential circuits transit to the first state when the timing detecting circuit detects that the values of the test clock pulses correspond with the second data;
wherein the gates open and first test clock pulses pass through the gates to the flip-flops in the first state, if the second data is a predetermined value;
wherein the sequential circuits transit to a second state after the first state; and
wherein the gates open and second test clock pulses pass through the gates to the flip-flops in the second state, if the third data is a predetermined value.

8. The semiconductor integrated circuit device according to claim 7,
wherein the sequential circuits concurrently transit to the first state when the timing detecting circuit detects that the values of the clock pulses correspond with the first data and output a timing detecting signal to the sequential circuits.

9. The semiconductor integrated circuit device according to claim 7,
wherein a test pattern is supplied to the flip-flops in the front side of the logic stages under a condition that supply of the test clock pulses are stopped.

10. The semiconductor integrated circuit device according to claim 7,
wherein the flip-flops in the front stage output a test pattern fetched beforehand to the logic stages with the first test clock pulses,
wherein the logic stages execute logic processes corresponding to the test pattern and transfer results to the flip-flops in the next stage; and
wherein the flip-flops in the next stage of the logic stage fetch the results from the logic stage with the second test clock pulses.

11. The semiconductor integrated circuit device according to claim 7,
wherein the first data, the second data and the third data are rewritable.

* * * * *